United States Patent
John et al.

(10) Patent No.: US 10,216,892 B2
(45) Date of Patent: Feb. 26, 2019

(54) SYSTEM AND METHOD FOR INTERACTIVE VEHICLE DESIGN UTILIZING PERFORMANCE SIMULATION AND PREDICTION IN EXECUTION OF TASKS

(71) Applicant: Honda Motor Co., Ltd., Tokyo (JP)

(72) Inventors: Chand T. John, Mountain View, CA (US); Behzad Dariush, San Ramon, CA (US)

(73) Assignee: Honda Motor Co., Ltd., Tokyo (JP)

( * ) Notice: Subject to any disclaimer, the term of this patent is extended or adjusted under 35 U.S.C. 154(b) by 1010 days.

(21) Appl. No.: 14/203,453

(22) Filed: Mar. 10, 2014

(65) Prior Publication Data

US 2015/0094991 A1 Apr. 2, 2015

Related U.S. Application Data

(63) Continuation-in-part of application No. 14/043,592, filed on Oct. 1, 2013, now Pat. No. 9,875,335.

(51) Int. Cl.
*G06F 7/60* (2006.01)
*G06F 17/50* (2006.01)

(52) U.S. Cl.
CPC ...... *G06F 17/5095* (2013.01); *G06F 17/5009* (2013.01)

(58) Field of Classification Search
CPC .................. G06F 17/5095; G06F 17/5009
USPC ............................................................ 703/2
See application file for complete search history.

(56) References Cited

U.S. PATENT DOCUMENTS

| 5,676,157 | A | 10/1997 | Kramer |
| 6,090,148 | A | 7/2000 | Weber et al. |
| 6,096,087 | A | 8/2000 | Weber et al. |
| 6,840,125 | B1 | 1/2005 | Reynolds et al. |
| 6,982,635 | B2 | 1/2006 | Obradovich |

(Continued)

FOREIGN PATENT DOCUMENTS

| EP | 1179817 | 2/2002 |
| EP | 1629949 | 10/2010 |
| WO | WO199523054 | 8/1995 |

OTHER PUBLICATIONS

Yoshikawa_1985, Yoshikawa, T., Measure of Manipulatability for Robot Manipulators, J. of Robotics Society of Japan, 2-1, 63/67 (1984).*

(Continued)

*Primary Examiner* — Brian S Cook
(74) *Attorney, Agent, or Firm* — Rankin, Hill & Clark LLP

(57) ABSTRACT

A computer-implemented method for interactive vehicle package design includes receiving vehicle occupant package design model data. The vehicle occupant package design model data includes a task to be executed. The method also includes receiving parameters defining a virtual human subject for executing the task. The virtual human subject includes a plurality of degrees of freedom. The method includes determining a plurality of motion descriptors of the virtual human subject including determining a manipulation over time of the degrees of freedom of the virtual human subject during accomplishment of the task, and determining one or more performance metrics based on the motion descriptors. The method further includes generating a visual representation of the vehicle occupant package design model, the virtual human subject, and the task to be executed.

13 Claims, 15 Drawing Sheets

(56) References Cited

U.S. PATENT DOCUMENTS

| | | | |
|---|---|---|---|
| 7,519,522 | B2 | 4/2009 | Smith et al. |
| 7,684,896 | B2 | 3/2010 | Dariush |
| 7,797,138 | B2 | 9/2010 | Reynolds et al. |
| 8,301,421 | B2 | 10/2012 | Bacon et al. |
| 2004/0118229 | A1 | 6/2004 | Reynolds et al. |
| 2004/0220705 | A1 | 11/2004 | Basir et al. |
| 2004/0263531 | A1 | 12/2004 | Maille et al. |
| 2005/0001842 | A1 | 1/2005 | Park et al. |
| 2005/0242650 | A1 | 11/2005 | Reynolds et al. |
| 2006/0038832 | A1* | 2/2006 | Smith .................. G06F 17/5095 345/629 |
| 2009/0252423 | A1 | 10/2009 | Zhu et al. |
| 2009/0278915 | A1 | 11/2009 | Kramer et al. |
| 2011/0043537 | A1 | 2/2011 | Dellon et al. |
| 2012/0283996 | A1 | 11/2012 | Watson et al. |
| 2013/0268256 | A1 | 10/2013 | Dariush |

OTHER PUBLICATIONS

Umetani_2001, Umetani, Y., Workspace and Manipulability Analysis of Space Manipulator, Trans. of the Society of Instrument and Control Engineers vol. E-1, No. 1, 116/123 (2001)).*

Cheraghpour_2011, Cheraghpour, F., Multi-aspect Grasp Index for Robotic Arm, Scientia Iranica B (2011) 18 (2), 222-230.*

Reed_2003 (Reed, M.P., A New Approach to Modeling Driver Reach, SAE Technical Paper Series, 2003-01-0587 Reprinted from: Human Factors in Driving, Seating, & Vision (SP-1772)).*

Tanev_2000 (Taney, T., On the Performance Indexes for Robot Manipulators, Problems of Engineering Cybernetics and Robotics, 49, 2000).*

Hada_1999 (Hada, M., An Evaluation of Vehicle Driver's Steering Comfort with Dexterity Measures of 3-Dimensional Human Model, IEEE 1999).*

Duffy_2008 (Handbook of Digital Human Modeling, CRC Press 2008).*

B. Dariush. Real Time Multi-Objective Posture Prediction of Movement Tasks. International Summit on Human Simulation, May 23-25, 2012.

Thelen DG. Adjustment of Muscle Mechanics Model Parameters to Simulate Dynamic Contractions in Older Adults. J Biomech Eng. Feb. 2003;125(1):70-7.

B. Dariush, Y. Zhu, A. Arumbakkam, K. Fujimura. Constrained Closed Loop Inverse Kinematics. 2010 IEEE International Conference on Robotics and Automation, May 3-8, 2010, Anchorage, Alaska, USA. http://behzaddariush.com/attachments/File/Publications/ICRA2010_CCLIK.pdf.

Davy, D.T., Audu, M.L, 1987. A dynamic optimization technique for predicting muscle forces in the swing phase of gait. Journal of Biomechanics 20, 187-201. http://e.guigon.free.fr/rsc/article/DavyAudu87.pdf.

Anderson, F.C., Pandy, M.G., 1999. A dynamic optimization solution for vertical jumping in three dimensions. Computer Methods in Biomechanics and Biomedical Engineering 2, 201-231. http://people.stfx.ca/smackenz/Courses/DirectedStudy/Articles/DynOptJumping1999.pdf.

Umberger BR & Rubenson J. (2011). Understanding muscle energetics in locomotion: new modeling and experimental approaches. Exercise and Sports Sciences Reviews 39, 59-67. http://mfll-uwa.jonasrubenson.com/PDF_files/Umberger_Rubenson_2011.pdf.

Ex Parte Quayle Action of U.S. Appl. No. 13/797,722, dated Jul. 7, 2015.

Faraway, J. et al., "Statistics for Digital Human Motion Modeling in Ergonomics," Technometrics, Aug. 2007, pp. 277-290, vol. 49, No. 3, American Statistical Association and the American Society for Quality.

Maciejewski, A et al., "Obstacle Avoidance for Kinematically Redundant Manipulators in Dynamically Varying Environments," The International Journal of Robotics Research, Fall 1985, pp. 109-117, vol. 4, No. 3, Massachusetts Institute of Technology, USA.

Parkinson, M. et al., "Optimizing Vehicle Occupant Packaging," SAE Technical Paper Series, 2006-01-0961, 2006 twelve pages, SAE International.

Parkinson, M. et al., "Robust Truck Cabin Layout Optimization Using Advanced Driver Variance Models," Proceedings of the IDETC/CIE ASME 2005 International Design Engineering Technical Conferences & Computers and Information in Engineering Conference, DETC2005-84179, Sep. 24-28, 2005, pp. 1103-1109, Long Beach, California, USA.

PCT International Search Report and Opinion, PCT Application No. PCT/US2013/035577, dated Jul. 11, 2013, eight pages.

Reed, M. et al., "A Statistical Method for Predicting Automobile Driving Posture," Human Factors, Winter 2002, pp. 557-568, vol. 44, No. 4.

Reed, M. et al., "Automobile Occupant Posture Prediction for Use with Human Models," SAE Technical Paper Series, 1999-01-0966, International Congress and Exposition, Mar. 1-4, 1999, twelve pages, Detroit, Michigan, USA, SAE International.

Reed, M. et al., "Comparison of Methods for Predicting Automobile Driver Posture," SAE Technical Paper Series, 2001-01-2180, Digital Human Modeling for Design and Engineering Conference and Exposition, Jun. 6-8, 2000, twelve pages, Dearborn, Michigan, USA, SAE International.

Reed, M. et al., "Effects of Vehicle Interior Geometry and Anthropometric Variables on Automobile Driving Posture," Human Factors, Winter 2000, pp. 541-552, vol. 42, No. 4.

Reed, M. et al., "Methods for Measuring and Representing Automobile Occupant Posture," SAE Technical Paper Series, 1999-01-0959, International Congress and Exposition, Mar. 1-4, 1999, fourteen pages, Detroit, Michigan, USA.

Reed, M. et al., "Modeling Population Distributions of Subjective Ratings," SAE Technical Paper Series, 2001-01-2122, Digital Human Modeling for Design and Engineering Conference and Exposition, Jun. 26-28, 2001, eight pages, Arlington, Virigina, USA.

Reed, M. et al., "Modeling Vehicle Occupant Head and Head Restraint Positions," UMRTI-2001-08, University of Michigan Transportation Research Institute, Biosciences Division, USA, Apr. 2001, seventy pages.

Shi, X. et al., "Determinants of Driver vs. Second Row Occupant Posture Modeling," Queensland University of Technology, 2011, nine pages, Brisbane, Australia.

Siemens Product Lifecycle Management Software, Inc., "Occupant Packaging Toolkit: Siemens PLM Software," three pages. [Online] [Retrieved Apr. 17, 2012] Retrieved from the Internet <URL: https://www.plm.automation.siemens.com/es_sa/products/tecnomatix/assembly_planning/jack/occupant_packaging_toolkit.shtml#lightview-close.>.

Yang, J. et al., "Multi-objective Optimization for Upper Body Posture Prediction," American Institute of Aeronautics and Astronautics, Date Unknown, eighteen pages.

Zhang, X. et al., "A three-dimensional dynamic posture prediction model for simulating in-vehicle seated reaching movements: development and validation," Ergonomics, 2000, pp. 1314-1330, vol. 43, No. 9.

Chiacchio, P., "A new dynamic manipulability ellipsoid for redundant manipulators," Robotica, 2000, pp. 381-387.

Dariush, B., "Real Time Multi-Objective Posture Prediction of Movement Tasks,"Honda Research Institute, Date Unknown, USA, twelve pages.

Dassault Systemes, "DELMIA Virtual Ergonomics Solution: A powerful digital human modeling tool to create, validate and simulate human worker interaction for manufacturing," Date Unknown, four pages. [Online] [Retrieved Jan. 7, 2013] Retrieved from Internet <URL:https://www.3ds.com/fileadmin/PRODUCTS/DELMIA/OFFERS/Virtual-Ergonomics-Solutions/PDF/DELMIA-Virtual-Ergonomics-brochure.pdf?xtmc=Virtual_Ergonomics_Solution&xtcr=1.>.

Dassault Systemes, ENOVIA V5 DMU for Vehicle Occupant Accommodation, Date Unknown, two pages [Online] [Retrieved Jan. 7, 2013] Retrieved from the Internet <URL: http://www.3ds.com.>.

Forkenbrock, G.J. et al., "An Assessment of Human Driver Steering Capability," National Highway Traffic Safety Administration, Report No. DOT HS 809 875, Jun. 2005, thirty-three pages.

(56) References Cited

OTHER PUBLICATIONS

Hada, M. et al., "An Evaluation of Vehicle Driver's Steering Comfort with Dexterity Measures of 3-Dimensional Human Model," IEEE, 1999, pp. II-283-II-288.

Reed, M. et al., "A New Approach to Modeling Driver Reach," 2003 SAE World Congress, Mar. 3-6, 2003, Detroit, Michigan, USA, twelve pages.

Rosenstein, M.T. et al., "Velocity-Dependent Dynamic Manipulability," International IEEE Conference on Robotics and Automation, 2002, six pages.

Wikipedia, "Manipulability ellipsoid," Jul. 2, 2013, one page. [Online] [Retrived Jul. 24, 2013] Retrieved from the Internet <URL:en.wikipedia.org/wiki/Manipulability_ellipsoid.>.

Yoshikawa, T. "Dynamic manipulability of robot manipulators," IEEE International Conference on Robotics and Automation, 1985, pp. 1033-1038, vol. 2.

Yoshikawa, T., "Manipulability of Robotic Mechanisms," The International Journal of Robotics Research, 1985, pp. 3-9.

Dariush_2009 (Online Transfer of Human Motion to Humanoids, International Journal of Humanoid Robotics, Jun. 2009).

Badler_1987 (Articulated Figure Positioning by Multiple Constraints, IEEE, 1987).

Ting-Yung_1999 (Kinematic Manipulability of General Constrained Rigid Multibody Systems, IEEE Transactions on Robotics and Automation, vol. 15, No. 3, Jun. 1999).

Fox_2010 (Cockpit Control Forces or How Robust Do Driver Controls Really Need to Be?, Jul. 2010).

Yang_2011, Yang, J., Multi-objective optimization-based method for kinematic posture prediction: Development and Validation, Robotica (2011) vol. 29, pp. 245-253.

Simpack_2005, SIMPACKNews, vol. 9, First Issue, INTEC Gmbh, Argelsrieder Feld 13, 82234 Wessling, Jul. 2005.

Mortimer_1970 Mortimer, R.G., Brake Force Requirement Study: Driver-Vehicle Braking Performance as a Function of Brake System Design Variables, HSRI Report No. HuF-6a, Apr. 10, 1970.

Office Action of U.S. Appl. No. 14/043,592, dated Dec. 23, 2016, 46 pages.

Office Action of U.S. Appl. No. 14/043,592, dated Apr. 14, 2017, 43 pages.

Office Action of U.S. Appl. No. 14/043,592, dated Sep. 13, 2017, 44 pages.

Marler et al., "A New Discomfort Function for Optimization-Based Posture Prediction", SAE International, Paper #2005-01-2680, https://doi.org/10.4271/2005-01-2680.

Janowski, "Transferring CAD/CAM Files", Modern Machine Shop, Article Post Jul. 15, 1999, http://www.mmsonline.com/articles/transferring-cadcam-files.

* cited by examiner

Velocity Manipulability Ellipsoid 700

Difficult to move, major axis $\sqrt{?_{min}}$

Easy to move, major axis $\sqrt{?_{max}}$

Plane of Manipulability Along Axis of Maximal Velocity

Plane of Manipulability Along Axis of Minimal Velocity

Overlap of Planes of Maximal and Minimal Velocity

Task Infeasible 1010

Task Able to be Completed with Extreme Discomfort 1020

Task Able to be Completed with Minor Discomfort 1030

Task Able to be Completed and Comfortable 1040

SYSTEM AND METHOD FOR INTERACTIVE VEHICLE DESIGN UTILIZING PERFORMANCE SIMULATION AND PREDICTION IN EXECUTION OF TASKS

RELATED APPLICATIONS

The application is a continuation-in-part of U.S. application Ser. No. 14/043,592 filed on Oct. 1, 2013, the content of which is incorporated by reference herein in their entirety.

BACKGROUND

Field of Disclosure

The disclosure generally relates to manipulability determinations for articulated models for use in vehicles for determining the usability of vehicle occupant package designs.

Description of the Related Art

Vehicle occupant packaging refers to the portions of the interior space of the vehicle that are occupied by the driver and passengers of the vehicle. Vehicle occupant packaging can include a number of different features including, for example, seat design, handbrake positioning and operation, steering wheel positioning and orientation, center console design, and door handle design and operation. Vehicle occupant packaging design refers to the general field that is concerned with designing vehicle occupant packaging so that a given vehicle's interior is both functional as well as comfortable. As vehicle designs vary widely and are iteratively improved with each new generation of vehicles, vehicle occupant packaging also needs to be redesigned and improved on a continual basis.

Typically, a new vehicle occupant packaging is tested by producing a full scale model of a given design, and then testing that design with a number of different human subjects. The human subjects used in the test will ideally be spread out across a wide range of physical characteristics including, for example, height, weight, gender, limb length (e.g., leg and arm length), strength, and joint range of motion. This helps ensure that a tested and approved vehicle occupant packaging will be operable by a significant majority of the human population.

Several different software simulation packages are available that allow for simulation of a vehicle occupant packaging design, as well as allow for simulation of testing of virtual subjects. These virtual subjects are computer models of human subjects, where the virtual subjects have the same variation of physical characteristics (e.g., height, weight, limb length) that are used in real life vehicle packaging design testing. Examples of these software packages include, for example, JACK offered by SIEMENS, and DELMIA offered by DASSAULT SYSTEMES.

These software packages improve the vehicle occupant packaging design process by allowing for design iteration without the need for a physical prototype for each design iteration. For example, software design packages allow a designer to test whether a human subject will fit in the given design (e.g., whether they will physically be able to reach the handbrake throughout its full range of motion). Further, these software packages allow calculation of a single static human posture when operating some aspect of the vehicle (e.g., the posture, fixed in time, when grasping the handbrake). Generally, these software packages calculate the single static posture using statistical regressions. However, these statistical regressions rely on a large amount of relevant experimental data in order to make posture predictions. As a result, relevant experimental data is not always available for the situation under consideration. For example, if you only have motion capture data of a handbrake pull with no load, then the posture cannot be determined when the load on the hand is 20 kilograms.

A drawback of existing design software packages is that they currently cannot provide the full range of information that is collected when conducting a live human subject test with a full scale test model. Consequently, it is still common practice to conduct a live test on a finalized (or semi-finalized) design, in order to make up for the deficiencies of existing software design packages.

SUMMARY

According to one aspect, a computer-implemented method for interactive vehicle package design includes receiving vehicle occupant package design model data including a task to be executed and receiving parameters defining a virtual human subject for executing the task, wherein the virtual human subject includes a plurality of degrees of freedom. The method includes determining a plurality of motion descriptors of the virtual human subject including determining a manipulation over time of the degrees of freedom of the virtual human subject during accomplishment of the task and determining one or more performance metrics based on the motion descriptors. The method also includes generating a visual representation of the vehicle occupant package design model, the virtual human subject and the task to be executed based on at least one of the motion descriptors and the one or more performance metrics for output on a display.

According to another aspect, an interactive vehicle package design system includes a processor for executing computer program code and a computer-readable storage medium containing the executable computer program code configured to receive vehicle occupant package design model data including a task to be executed and receive parameters defining a virtual human subject for executing the task, wherein the virtual human subject includes a plurality of degrees of freedom. The executable computer program code configured to determine a plurality of motion descriptors of the virtual human subject including determining a manipulation over time of the degrees of freedom of the virtual human subject during accomplishment of the task and determine one or more performance metrics based on the motion descriptors. The executable computer program code also configured to generate a visual representation of the vehicle package design model data, the virtual human subject and the task to be executed based on at least one of the motion descriptors and the one or more performance metrics for output on a display.

According to a further aspect, an interactive vehicle package design system includes an input/output device for receiving user input indicating parameters defining vehicle occupant package design model data including a task to be executed, the input/output device for receiving parameters defining a virtual human subject for executing the task, wherein the virtual human subject includes a plurality of degrees of freedom. The system also includes a processor communicatively coupled to the input/output device and including a design analysis system for determining a plurality of motion descriptors of the virtual human subject including determining a manipulation over time of the degrees of freedom of the virtual human subject during accomplishment of the task, and determining one or more performance metrics based on the motion descriptors. The design analysis system generates a visual representation of the vehicle occupant package design model data, the virtual human subject and the task to be executed based on at least one of the motion descriptors and the one or more performance metrics and presenting the visual representation on a graphical user interface of the input/output device.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

The figures depict various embodiments of the embodiments for purposes of illustration only. One skilled in the art will readily recognize from the following discussion that alternative embodiments of the structures and methods illustrated herein may be employed without departing from the principles of the embodiments described herein.

DETAILED DESCRIPTION

System Overview

Figure 1:
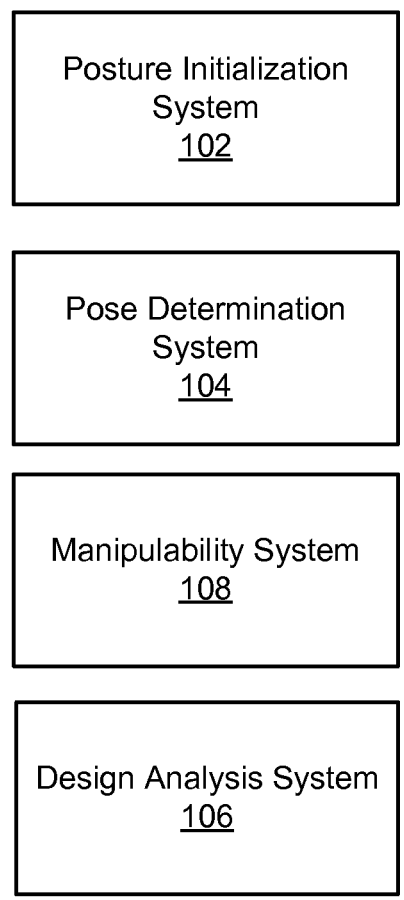
FIG. 1 is a block diagram illustrating an exemplary computer system for evaluating a vehicle occupant packaging design, according to one embodiment.

Figure (FIG. 1 is a block diagram illustrating a computer system 100 for evaluating a vehicle occupant packaging design, according to one embodiment. Generally, the computer system 100 receives a vehicle occupant packaging design (referred to simply as a design) to be evaluated, parameters describing an articulated model of a virtual subject, a set of constraints limiting the motion of the virtual subject within the design, and one or more physical tasks (also referred to as operational tasks) to be carried out by the virtual subject within the design. The computer system 100 is configured to determine (or track) the pose of the virtual subject as the virtual subject carries out one or more of the physical tasks in the design. The pose of the virtual subject in carrying out the task/s is analyzed to determine the manipulability metrics used to determine the feasibility (or usability) of the design for potential drivers and/or passengers matching the size and shape of the virtual subject.

The design describes the interior cockpit of a vehicle. The design includes a number of components, examples of which include a seat having a length and height, a headrest, a steering wheel, pedals (e.g., gas, brake, and clutch), a handbrake, an audio/video system located in a center console, instrument sticks (e.g., to control lights and wiper blades), and a dashboard. This list of components is merely exemplary and is not meant to be exhaustive. The design also include sizes (e.g., proportions) for components, as well as relative distances, absolute positions, and orientations between the various components. For example, the distance between the steering wheel and the seat, and between the pedals and the seat may also be included in the design. The design may also include ranges of possible positions for the various components. For example, in many designs the seat may be raised or lowered, tilted, or moved forward or backward within the frame of the cockpit as a whole. Similarly, the steering wheel may be moved forward or backward or raised or lowered. Being able to reposition and reorient these components greatly affects the usability of a particular vehicle occupant packaging design by different segments of the human population.

The virtual subject is represented by the computer system 100 as an articulated model of a real human subject. By modeling human subjects in terms of an articulated model, the computer system 100 allows for evaluation of the designs without the need for a full scale model and human test subjects. Generally, the articulated models of virtual subjects are similar, as most of the human population has two arms, two legs, a torso, a head, a neck, a waist etc. The parameters of the virtual subject allow for differentiation between virtual subjects which mirrors the differentiation between members of the human population as a whole. Parameters may include limb lengths (e.g., of the forearm, upper arm, the upper and lower leg, and torso length), virtual subject height in total, virtual subject total weight, joint ranges of motion, virtual subject vision field of view, disabilities, and other features. As above, this list of parameters is merely exemplary and is not meant to be exhaustive.

Figure 3:
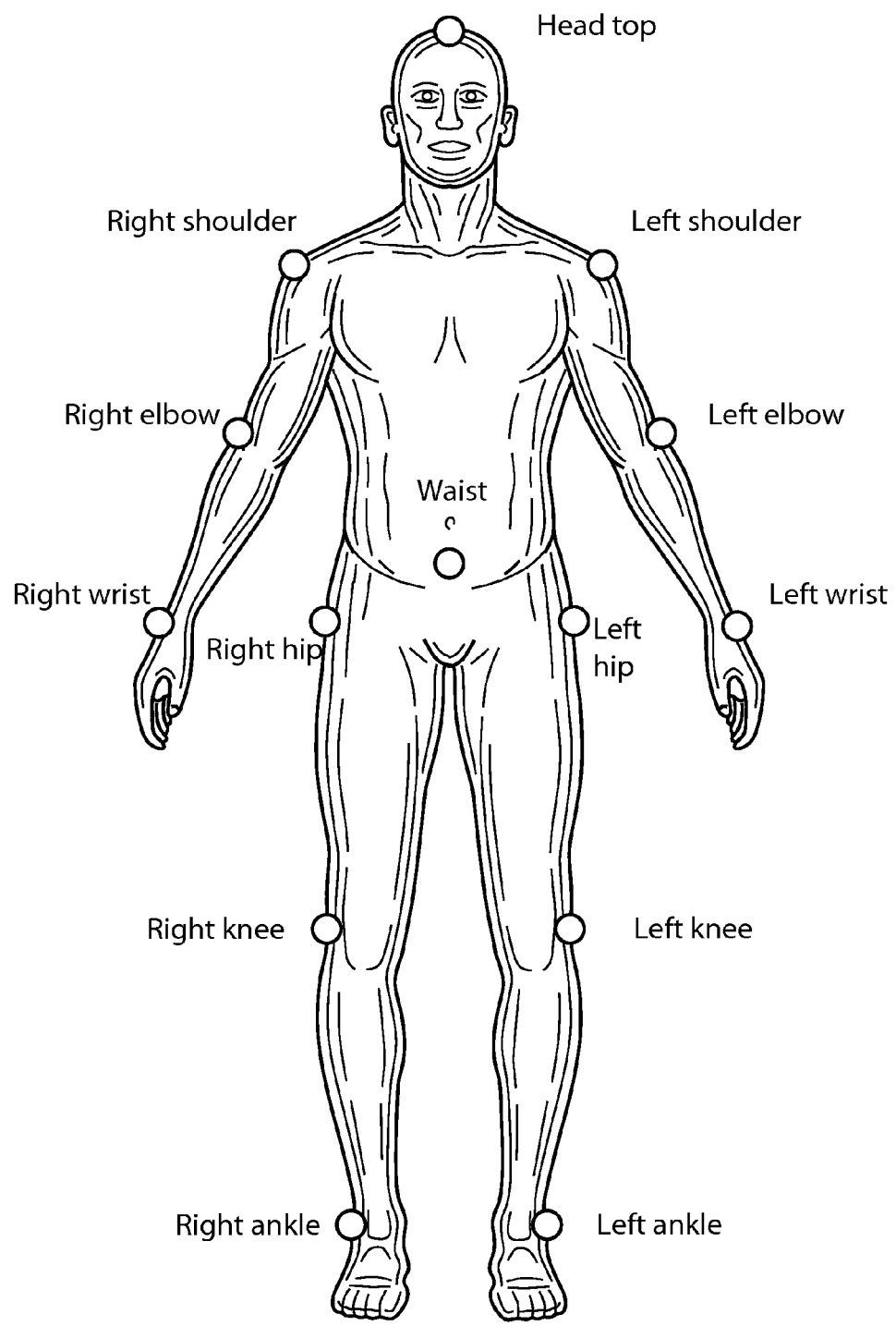
FIG. 3 is an example illustration of an articulated model of a virtual subject, according to one embodiment.

FIG. 3 is an example illustration of an articulated model of a virtual subject, according to one embodiment. In the example of FIG. 3, the virtual subject is defined by a number of features on the body including, for example, a head top, a right and left shoulder, a right and left elbow, a waist, a right and left wrist, a right and left hip, a right and left knee, and a right and left ankle. Generally, features are located at or near joints that can rotate about one or more axes. The axes around which a joint can rotate are referred to as degrees of freedom. A given joint may have more than one degree of freedom. For example, the human elbow can rotate about two axes, and thus has two different degrees of freedom. One degree of freedom is associated with flexion/extension and a second degree of freedom associated with pronation and supination. Collectively, the angles of the degrees of freedom of the virtual subject and the parameters fully specify the static positioning of all limbs of the virtual subject. This is also referred to as a posture.

In one implementation, the parameters received for a virtual subject represent one or more thresholds within human population as a whole. For example, the parameters received for a virtual subject may represent a driver or passenger who is in the 50th, 75th, 90th or 95th percentile for height and/or weight and/or limb length, and/or with respect to some other criteria. Evaluating a virtual subject representative of one of these thresholds allows the computer system 100 to determine the feasibility of a vehicle design with respect to a proportion of the population. For example, the parameters for two different virtual subjects may represent the 5th and 95th percentile of the human population by height. The computer system 100 may evaluate the design with respect to these two virtual subjects. If the design is feasible for both of these virtual subjects, the computer system 100 may conclude that the design is feasible for the entire portion of the human population falling within the 5th and 95th percentile by height. Testing designs against virtual subjects meeting various thresholds improves the efficiency of design testing by avoiding testing unnecessary virtual subjects who fall within ranges already tested. Testing virtual subjects who represents thresholds also allows the computer system 100 to report feasibility findings that are similar to industry expected test results.

Tasks set forth objectives to be accomplished through motion of the virtual subject within the design. Tasks may include, for example, manipulation of one or more components of the design (e.g., the pulling the handbrake). In one implementation, a task may set forth a specific path of motion to be followed in order for the task to be accomplished. When the virtual subject reaches the end point of the specified path, the task is considered to be completed. Specified paths may be used where the design itself dictates how certain components within the design may be manipulated. Using the handbrake example from above, the design may specify that when pulling the handbrake, the handbrake can only travel through a certain path, such as making an angular rotation relative to a fixed point. In other instances, rather than specifying a path of motion, a task may also merely specify a starting point and an end point for a task (e.g., motion of an overhead sun visor to cover the top of the driver's side window). In these instances, the pose of the virtual subject is tracked through one of many possible paths which reaches the end point. When the end point is reached, the task is considered completed.

The set of constraints limit how the virtual subject may move within the design while accomplishing the tasks. The set of constraints may include several different types of constraints including, for example, one or more contact constraints, one or more discomfort constraints, one or more joint limit constraints, one or more collision avoidance constraints, and a dynamic consistency constraint. For example, a contact constraint may be specified to indicate that the virtual subject maintain contact between the subject's upper legs and/or back and the car seat throughout accomplishment of the task. Another contact constraint may be defined to maintain contact between the subject's feet and the car's pedals, and so on.

In one implementation, the computer system 100 includes a posture initialization system 102, a pose determination system 104, a manipulability system 108, and a design analysis system 106.

The posture initialization system 102 is configured to determine an initial posture of the virtual subject using the design, the virtual subject parameters, the task/s to be completed, and the set of constraints. As introduced above, posture refers to the static pose of the virtual subject at a particular instant in time. In one implementation, the posture includes a vector of values, each value describing an orientation (or angle) of a degree of freedom of the articulated model of the virtual subject at that instant in time. The initial posture of the subject is determined from a point in time just before the beginning of any of the tasks to be completed. For example, if the task to be completed is pulling the handbrake of the vehicle, the initial posture of the virtual subject is determined such that the virtual subject has their hand on the handbrake, but has not yet begun pulling.

In one embodiment, the task/s to be completed specify initial conditions for the virtual subject's posture prior to beginning the tasks. Using the handbrake example above, these initial conditions may include specifying where the virtual subject's hand should be positioned just prior to starting the task. If the virtual subject is unable to satisfy even the initial conditions of the task (let alone accomplish the task), then the computer system 100 may exit out of this process and indicate that the specified tasks cannot be completed for the specified virtual subject. Initial posture determination is further described below.

Using the initial posture, the pose determination system 104 is configured to determine the pose of the virtual subject as the virtual subject carries out one or more specified tasks while also adhering to the set of constraints. Pose can refer to the dynamic (e.g., time varying) posture of the virtual subject throughout the accomplishment of the tasks. In one implementation, the pose includes a number of individual postures captured at sequential units of time. The pose determination system 104 is configured to receive as input the initial posture prior to starting the task, the parameters of the virtual subject, the task/s to be completed, and a set of constraints limiting the path of motion taken to accomplish the tasks. As part of the determination of a posture, the pose determination system 104 determines a Jacobian that used to move the subject between one time step and the next in accomplishing the task. If the virtual subject is unable to complete the specified tasks without violating the constraints, then the computer system 100 may exit out of this process and indicate that the specified tasks cannot be completed for the specified virtual subject. The determination of pose throughout the accomplishment of one or more tasks is described below.

The manipulability system 108 is configured to make use of a Jacobian determined as part of the pose, the task to be accomplished, and a particular endpoint direction of motion indicating the path the subject used to accomplish the task to determine one or more manipulability metrics at the end point of the task. Examples of manipulability metrics include a force manipulability metric, a velocity manipulability metric, and a dynamic manipulability metric. The manipulability system 108 is configured to generate the manipulability metrics for a number of different endpoints of the task in three-dimensional coordinate space. In this way, the manipulability metrics can be determined for entire portions and/or the entirety of the interior space of the design.

The design analysis system 106 is configured to analyze the manipulability metrics of a task to determine the feasibility of the design as a function of position in three dimensional space. Feasibility may be determined for each individual type of metric (e.g., force, velocity, dynamic), or as a function of more than one manipulability metric. Other factors may also be included in the feasibility calculation including, for example, the physiological effort that the virtual subject maintains to hold a static pose upon completion of a task, and the amount of energy consumed to accomplish the task starting from the initial posture. Based on this analysis, feasibility may also be formulated as a yes/no answer indicating whether or not the virtual subject is able to complete the designated tasks in the design while also adhering to the set constraints. Feasibility may also be formulated in terms of one or more numerical values indicating, for example, the raw manipulability metrics or some derivation there from. These numerical values may collectively represent feasibility, and/or may be combined into a single number using a closed-form analytic function to provide a single feasibility value.

Initial Posture Determination

As introduced above, the posture initialization system 102 is configured to determine an initial posture of the subject prior to starting the task/s to be accomplished subject to the set of constraints imposed on the virtual subject's motion. In one embodiment, the initial posture is determined using a numerically iterative multi objective optimization (MOO) technique. The initial posture is based on the parameters of the virtual subject. The parameters include anthropometric parameters such as limb dimensions, limb masses, limb inertia, limb center of gravity, etc. These parameters dictate how the various limbs are scaled.

Using this technique, system 102 outputs the initial posture as a vector q at $t=t_o$ prior to beginning the task while the virtual subject is within the design. The vector q includes a numerical value for each degree of freedom in the articulated model of the virtual subject. That is, the initial posture describes the orientation of every joint in the virtual subject's body. The vector q is implicitly a function of the parameters, and the scale of the limbs derived from the parameters using statistical regression. The initial posture is in the frame of reference of the design, and thus, the initial posture describes how the virtual subject is positioned within the vehicle design. An example initial posture can be qualitatively described as the virtual subject sitting in the car seat with their arms on the steering wheel and their feet on the pedals.

To determine the initial posture, the system 102 finds the vector q that is a local minimum to a scalar function f(q) subject to the set of constraints c(q) on the allowable orientations for each degree of freedom in q. For an individual degree of freedom q, this may be represented as:

$$\min_q f(q) \quad (1)$$
$$\text{s.t.} \quad u_{lb} \le c(q) \le u_{ub}.$$
$$q_{min} \le q \le q_{max}$$

The function f(q) includes two separate objectives, f1(q) and f2(q) such that f(q)=f1(q)+f2(q). The first objective f1(q) minimizes the distance between the current positions of the features of the virtual subject (e.g., their hands and feet), as specified by the vector of degrees of freedom q and the parameters, and the position the virtual subject's features should be in to begin the task, as specified in the vector p. In one embodiment, this minimization is accomplished based on the sum to squared tracking error norm:

$$f1(q) = \frac{1}{2}\sum_{i=1}^{k} \beta_i \|e_i\|^2 \quad (2)$$

In this case, $e_i$ is the tracking error for each entry in the task vector p. The tracking error for an individual task may in general describe the position error, denoted by ($e_{p_i}$), and orientation error, denoted by ($e_{o_i}$).

$$e_i = [e_{o_i} e_{p_i}]^T \quad (3)$$

The position error is defined as $e_{p_i} = p_{d_i} - p_i$, where $p_{d_i}$ and $p_i$ correspond to the desired and predicted positions for the task, respectively. The orientation error in terms of an angle and axis error is defined as $$e_o = \frac{1}{2}(n \times n_r + s \times s_r + a \times a_r) \quad (4)$$

where $R_{d_i} = [n_r \, s_r \, a_r]$ and $R_i = [n \, s \, a]$ correspond to the desired and predicted unit vector triple representation of the task p, respectively. The desired position and desired orientation of the task/s are part of the design (or are determined by measurement). The predicted position and predicted orientation of the task/s are a function of the computed vector q. The predicted position and orientation of the task/s are determined using a forward kinematics function. Further, $\beta_i$ is a scalar to give a relative priority for the execution of each of the tasks to be performed.

The second objective minimizes a discomfort constraint as defined by Equation 25, described further below. This preferences the initial posture towards joint positions that are more comfortable for the user.

$$f2(q) = \frac{1}{2}\|h_1(q)\|^2 \quad (5)$$

The minimization of the function f(q) is subject to a constraint function c(q) that is bounded by $u_{lb}$ (lower bound) and $u_{ub}$ (upper bound). Thus, f(q) is minimized while always maintaining c(q) between $u_{lb}$ and $u_{ub}$. The values of $u_{lb}$ and $u_{ub}$ may be finite or infinite. In one embodiment, the constraint function c(q) includes two parts, c1(q) and c2(q) such that c(q)=c1(q)+c2(q). The first constraint function c1(q) enforces constraints on the joint torques $\tau_s$ exerted by the joints of the virtual subject at static equilibrium.

$$\tau_s = c_1(q) = \tau_g(q) + J^T f_{es} \quad (6)$$

where $f_{es}$ are the external forces operating on the virtual subject's joints under static conditions and where $\tau_g(q)$ describe gravitational torques operating on the virtual subject's joints which may be calculated from, $$\tau_g(q) = \Sigma_{j=1}^n m_j g^T J_{cog_j} \quad (7)$$

where $J_{cog_j}$ denotes the Jacobian matrix at the center of gravity of each segment and g is the 3×1 vector of gravitational acceleration.

The second constraint function c2(q) is used to avoid self-collisions and collisions with the environment. In one implementation, $c2(q) = d_k(q)$ where $$d_k(q) > 0 \forall k \in \{1, n_c\} \quad (8)$$

where $d_k$ is the minimum distance between a possible $n_c$ pairs of points including a point on the virtual subject's body, and either another point on the virtual subject's body or a point on another external object present in the design being tested. Thus, while minimizing f(q) at all times $d_k(q)$ is maintained to be greater than zero for all points on the virtual subject's body.

In summary, the initial posture is determined according to the following:

$$\min_q f_1(q) + f_2(q) \quad (9)$$
$$\text{s.t.} \quad q_{min} \leq q \leq q_{max}.$$
$$\tau_{lb} \leq \tau_s < \tau_{ub}.$$
$$0 < d_k(q)$$
$$\forall k \in \{1, n_c\}$$

In one embodiment, the initial posture may be determined using a nonlinear constrained optimization solver. Examples of nonlinear constrained optimization solvers include the MATLAB™ OPTIMIZATION TOOLBOX and the nonlinear interior point trust region optimization (KNITRO).

Pose Determination

Kinematic Model

As introduced above, the pose determination system 104 is configured to determine the pose of the subject through the accomplishment of one or more tasks while also adhering to the set of constraints imposed on the virtual subject's motion. In one embodiment, the initial posture is determined using a closed form multi objective optimization (MOO) technique. This technique incorporates a differential kinematic model to determine pose. The technique is analytically derived and runs in real-time.

Using this initial posture as a starting point, system 104 outputs the pose as a set of posture vectors q at a number of times t after the initial posture at $t_o$, where the number of times t depends upon the number of posture frames desired in the pose and the tasks to be completed. As above, each vector q includes a numerical value for each degree of freedom in the articulated model of the virtual subject. The posture at time t may be represented as vector $q = [q_1, \ldots, q_n]^T$. Here, n represents the total number of degrees of freedom. Individually, each vector for an individual time t represents a posture of the virtual subject. Collectively, the vectors q along with the parameters represent the pose of the virtual subject. For example, if the task is to pull the handbrake, the pose would represent the orientations (and thus positions) of the virtual subject's joints throughout the motion of pulling the handbrake from start to finish.

Regarding tasks, there may be more than one task to be completed. Consequently, here i(i=1 . . . k) is the index associated with each task. Consider a scenario to execute k operational tasks whose time history of position and/or orientation is specified. For each task, the vector p represents the time history of positions and/or orientations of each task. Whereas the virtual subject is represented using only angles for each degree of freedom, in contrast the vector p for a task may include both positions (i.e., Cartesian) components, as well as rotational (i.e., angular) components.

Pose determination is a kinematic tracking control problem, in that the pose determination system 104 attempts to have the pose track the tasks. For tasks, a spatial velocity vector associated with a task specified is given by, $$\dot{v}_i = [w_i \dot{p}_i]^T, \quad (10)$$

where $w_i$ is the angular velocity of the task frame and $v_i = \dot{p}_i$ is the Cartesian velocity of task i. Here, the reference frame of the task p is with reference to a global coordinate system that is initially aligned with the virtual subject's pelvis. The task frame is the reference frame of the body segment associated with a task p. The motion of the task p can be described relative to a global reference frame that is external to the body, or relative to the motion of the virtual subject's pelvis. Not all tasks will have both position and orientation components. Some tasks will have only position components, and some tasks can have only orientation components.

To determine the posture of the articulated model at any instant in time after the initial posture at $t_o$, a differential kinematic model is used. The differential kinematic model maps the motion accomplishing each of the specified tasks (e.g., by a path or using starting and end points) to a corresponding motion by the virtual subject. This is accomplished by changing the values of the virtual subject's degrees of freedom (e.g., joints) over time. This creates a mapping between velocities of the joints (or joint space velocities) to the velocity of the task/s (or task space velocities). In one embodiment, the differential kinematic model for performing this mapping may be expressed as:

$$v = J\dot{q}, \quad (11)$$

where J corresponds to the augmented Jacobian matrix, $$J = [J_1^T \ldots J_i^T \ldots J_k^T]^T. \quad (12)$$

The Jacobian is the partial derivative of each task p (for k tasks) with request to $$q \left( \text{or } \frac{\partial p}{\partial q} \right).$$

Stated differently, it is the motion of the task with respect to the motion of the joints of the human subject. The Jacobian matrix may be decomposed to its rotational and translational components, denoted by $J_o$ and $J_p$, respectively.

$$J = \begin{bmatrix} J_o \\ J_p \end{bmatrix}. \quad (13)$$

The Jacobian is determined separately for each limb (or link) i of the subject for each unit of time t. Each pair of links i and the previous link $\rho(i)$ are coupled via one of the n joints. An initial Jacobian is determined for one of the links i. For the first posture in the pose, this can be determined based on the initial posture as described above. The Jacobians for subsequent links in that posture are determined recursively based on the already-determined Jacobian for the previously calculated link. More specifically, the Jacobian for joint i is $^iJ_i$ is $$^iJ_i = [^iX_{\rho(i)} {}^{\rho(i)}J_{\rho(i)} : \Psi_i]. \tag{14}$$

Here, $^iX_{\rho(i)}$ represents the transformation of a spatial vector quantity from the coordinate system of the previous link $\rho(i)$ to the next link i. The term $\Psi_i$ has dimensions of $6 \times n_i$ and represents the motion subspace (or free modes) of link i, and its columns make up a basis for this vector space. For example, the motion subspace about the z axis of a link connecting joint i and $\rho(i)$ is given by $$\Psi_i = [0\ 0\ 1\ 0\ 0\ 0]^T. \tag{15}$$

The Jacobian for the initial link in the chain is by $^1J_1 = \Psi_1$. More specifically, the Jacobian for the first link depends on the type of joint associated with the first link. If the joint is a revolute join, then the Jacobian is as in Equation 15. For whole body human models, the first link is typically defined by the pelvis, which is considered a floating link with 6 degrees of freedom. The Jacobian of such a joint is a 6×6 matrix which is a function of generalized coordinates q.

The Jacobian of the kth task descriptor is also determined. The Jacobian of a given task with respect to a given link i of the subject is determined by $^iX_k$.

The Jacobian at each time t is useful for both posture determination and manipulability metric determination. For posture determination, the order of operations for determining pose is that first an initial posture is determined, for example as described above in the section titled "Initial Posture determination." The initial posture is used to determine a Jacobian for determining the posture at the next unit of time. Using that subsequent posture, a Jacobian for the subsequent unit of time is determined. The subsequent Jacobian is used to determine the next posture, and so on until the task is completed. The Jacobians at these various times are then used to determine the manipulability metrics as will be described further below in the section titled "Manipulability Metric Determination."

Determining Pose with the Inverse of the Differential Kinematic Model

As a specific example of determining pose, using the differential kinematic model described in equation 11, the posture q at any given instant in time $t_l$ by determining $\dot{q} = \Delta q / \Delta t$ where $\Delta q = q_l - q_{l-1}$. At the start of the task, the initial posture can be used, for example as described above. In one embodiment, the posture q at a given instant in time $t_l$ is determined by minimizing the Cartesian error between the predicted task position and/or orientation $p_l$ at time $t_l$, and the vector $q_l$. A first order closed loop inverse kinematic (CLIK) formulation inverting equation 11 can be used to minimize the Cartesian error and determine posture q. A feedback correction term is added to improve tracking performance. The CLIK formulation is:

$$\dot{q} = J^+(\dot{v}_d + K_p e) \tag{16}$$

where $v_d$ is a desired spatial velocity vector and where e is the tracking error between a desired task vector and the predicted task vector. The predicted posture is obtained by numerical integration of Eq. 16. Once q is obtained, the predicted task vector can be computed by solving the forward kinematic equations which are a function of q. The desired task vector $p_l$, including positions and orientations ($P_d$, $\Theta_d$) is known from the task itself (e.g., from a provided path of motion or end point). $K_p$ is a diagonal feedback gain matrix that controls the rate of convergence of the error.

Here, the Jacobian $J^+$ is the right pseudo-inverse of J weighted by the positive definite matrix W $$J^+ = W^{-1}J^T(JW^{-1}J^T)^{-1}, \tag{17}$$

In practice, considering the occurrence of singularities in the matrix J, Eq. 17 may be replaced with a singularity robust damped least squares pseudo-inverse The tracking error e for an individual task i may include both position error, ($e_{p_i}$) and orientation error ($e_{o_i}$) components. These may be represented together as:

$$e_i = [e_{o_i} e_{p_i}]^T \tag{18}$$

The position error is simply defined as $e_{p_i} = p_{d_i} - p_i$, where $p_{d_i}$ and $p_i$ correspond to the desired and predicted task positions, respectively. Orientation error may be expressed in terms of an angle and axis error as:

$$e_o = \frac{1}{2}(n \times n_r + s \times s_r + a \times a_r) \tag{19}$$

where $R_{d_i} = [n_r\ s_r\ a_r]$ and $R_i = [n\ s\ a]$ correspond to the desired and predicted unit vector triple representation of the task orientation, respectively.

The weight matrix W enforces at least some of the constraints that limit the motion of the virtual subject within the design. In one embodiment, the weight matrix W is a composite weight matrix that enforces a joint limit constraint, a self-penetration constraint, a joint discomfort constraint, and an energy expenditure constraint (also referred to as a dynamic consistency constraint). In one embodiment, the composite weight matrix W is a diagonal matrix whose elements are derived from the set of constraints:

$$W = aW_h + (1-a)W_f + W_d \tag{20}$$

where $W_h$ is a weight matrix whose elements are derived from the joint limit constraint and joint discomfort constraint, $W_f$ is a weight matrix whose elements are derived from the collision constraint, and $W_d$ is weight matrix whose elements are derived from the energy expenditure constraint. The parameter a is a scalar index which can be used to modulate the contribution of the first two weight matrices. Each of these constraints is further described below.

Incorporation of Contact Constrians into Pose Determination

In evaluating designs, one type of constraint is a contact constraint between the virtual subject and components of the design. Contact constraints indicate surfaces that the virtual subject is expected to maintain contact with throughout the accomplishment of tasks. Examples of contact constraints are constant contact between the virtual subject's legs and back against the seat, head against the headrest, and feet against one or more of the pedals.

In one implementation, contact constraints are incorporated into the inverse kinematic model described in equation 16 above. In this implementation, the tasks to be accomplished and the contact constraints to be obeyed are viewed as separate sub-tasks, each with their own priority for accomplishment. The contact constraints are the higher priority sub-task. The actual (or operational) tasks to be accomplished are the lower priority sub-task. In one embodiment, the operational tasks to be accomplished operate in the null-space of the contact constraint sub-task. Failure to simultaneously enforce contact constraints while accomplishing operational tasks suggests that the design is not feasible for the virtual subject in question. The number of contact constraints which can be enforced depends on the degree of redundancy of the system. The degree of redundancy can be determined based on the number of degrees of freedom of the virtual subject less the number of degrees of freedom required to accomplish the task/s and also obey the set of constraints. Contact constraints can be prioritized in advance or during the simulation to give higher priority to one constraint over another.

Using the differential kinematic model from equation 11 above, contact constraints can be expressed as:

$$v_c = J_c \dot{q} \quad (21)$$

where $v_c$ is the velocity vector of the constraint and $J_c$ is the associated Jacobian. In many cases, the contact constraints include points of contact between the virtual subject and a component of the design, where the points of contact that are fixed relative to the global frame. In these cases, therefore, $v_c = 0$.

The inverse kinematic model incorporating the kinematic model for accomplishing tasks and the kinematic model for adhering to a contact constraint may be represented by $$\dot{q} = J_c^+ v_c + \hat{J}_t^+ (v_t^* - J_t J_c^+ v_c) \quad (22)$$

where $$\hat{J} = J(I - J_c^+ J_c) \quad (23)$$

and where I is the identity matrix, and $v^* = (v_d + K_p e)$, and where as above, $J^+ = W^{-1} J^T (JW^{-1} J^T)^{-1}$ (equation 17, repeated for clarity) and where $$J_c^+ = W^{-1} J_c^T (J_c W^{-1} J_c^T)^{-1}. \quad (24)$$

The first term in Eq. 22, $J_c^+ v_c$, $v_c$, describes the higher priority sub task to enforce contact constraints. The second term, $\hat{J}_t^+ (v_t^* - J_t J_c^+ v_c)$, lies in the null space of the primary sub task and is included to execute the operational tasks. As described previously, the generalized inverses in equation 22, $J_c^+$ and $\hat{J}^+$, are weighted by W to satisfy constraints in the set of constraints other than the contact constraints.

As introduced above, the posture q at any given instant in time $t_l$ by determining $\dot{q} = q_l - q_{l-1}$.

Discomfort and Joint Limit Constraints

The discomfort constraint is configured to reward virtual subject postures where the subject's joints are near a neutral position and increasingly penalizes virtual subject postures as the subject's joints approach joint limits. Thus, the discomfort constraint evaluates the virtual subject's discomfort level based on the current angle of the subject's joints ($q_i$ for joint i) relative to each joint's upper ($q_{i,max}$) and lower ($q_{i,min}$) angular limit. According to this, the discomfort constraint $h_1(q)$ may be expressed as:

$$h_1(q) = \sum_{i=1}^{n} \alpha_i \left( \frac{q_i - q_{i,N}}{q_{i,max} - q_{i,min}} \right)^2 \quad (25)$$

where $a_i$ is a joint-dependent scaling factor, $q_i$ represents the generalized coordinates of the $i_{th}$ degree of freedom, and $q_{i,N}$ is the neutral position of joint.

The gradient of $h_1$, denoted as $\nabla h_1$, represents a joint limit gradient function, an n×1 vector whose entries point in the direction of the fastest rate of increase of $h_1(q)$.

$$\nabla h_1 = \frac{\partial h_1}{\partial q} = \left[ \frac{\partial h_1}{\partial q_1}, \ldots, \frac{\partial h_1}{\partial q_n} \right]. \quad (26)$$

The element associated with joint i is given by $$\nabla h_{1i} = \frac{\partial h_1}{\partial q_i} = 2\alpha_i \left( \frac{q_i - q_{i,N}}{q_{i,max} - q_{i,min}} \right) \quad (27)$$

The function $|\nabla h_{1i}|$ is equal to zero if the joint is at its neutral posture and increases linearly toward the limits.

While the discomfort constraint penalizes joint motions that are away from a joint's neutral position, it does not enforce joint limit constraints. The joint limit constraint may be expressed as $$h_2(q) = \sum_{i=1}^{n} \frac{1}{4} \frac{(q_{i,max} - q_{i,min})^2}{(q_{i,max} - q_i)(q_i - q_{i,min})} \quad (28)$$

The joint limit function $h_2$ has higher values when joints near their limits and tends to infinity at the joint limits. The gradient of the joint limit function is given by:

$$\nabla h_{2_i} = \frac{(q_{i,max} - q_{i,min})^2 (2q_i - q_{i,max} - q_{i,min})}{4(q_{i,max} - q_i)^2 (q_i - q_{i,min})^2} \quad (29)$$

The function $\nabla h_i$ is equal to zero if the joint is at the middle of its range and goes to infinity at either limit.

The superposition of the joint limit and discomfort constraints combines their individual effects, preventing the joints from violating their limits and penalizing joint motions that are away from their neutral positions. The combination of the two constraints may be expressed as:

$$h(q) = h_1(q) + h_2(q) \quad (30)$$

The gradient of the combination function h(q) is used to construct the weight matrix, $W_h$, used in determining pose, for one or more joint limit and discomfort constraints. $W_h$ is an n×n diagonal matrix with diagonal elements $W_{h_i}$. The diagonal elements are computed by:

$$W_{h_i} = \begin{cases} 1 + |\nabla h_i| & \text{if } \Delta |\nabla h_i| \geq 0, \\ 1 & \text{if } \Delta |\nabla h_i| < 0. \end{cases} \quad (31)$$

The term $h_i$ is the combined joint and discomfort constraint for joint i, $\nabla h_i$ is the gradient, and term $\Delta |\nabla h_i|$ represents the change in the magnitude of the gradient. A positive value indicates the joint is moving toward its limit while a negative value indicates the joint is moving away from its limit. When a joint moves toward its limit, the associated weighting factor $W_{h_i}$ becomes very large causing motion of the joint to slow down in the resulting pose determination (e.g., in the determination of q in the next instant in time). When the joint nearly reaches its limit, the weighting factor $W_{h_i}$ approaches infinity and the corresponding joint virtually stops in the resulting pose determination. If the joint is moving away from the limit, the motion of the joint is unrestricted.

Collision Avoidance Constraints

The collision avoidance constraint prevents collision between different segments of the articulated model of the virtual subject (e.g., the arm and the chest), or between a segment of the articulated model and a component of the design (e.g., the arm and the door). If the two segments are connected at a joint, collision between the two segments can be prevented by limiting the joint range using the joint limit constraint. The collision avoidance constraint is configured to prevent collisions between segments that do not share the same joint, and between a segment and a component in the design. The collision avoidance constraint includes a minimum Euclidian distance d (d≥0) between the two colliding things (either two segments or a segment and a component. In one embodiment, the collision constraint f(q, d) has a maximum value at d=0 and decays exponentially toward zero as d increases, for example:

$$f = \rho e^{-\alpha d} d^{-\beta} \tag{32}$$

The rate of decay is controlled by adjusting the parameters α and β. By increasing α, the exponential rate of decay can be controlled so that the function approaches zero more quickly. The parameter ρ controls the amplitude. The gradient of the collision constraint f, denoted as ∇f is an n×1 vector whose entries point in the direction of the fastest rate of increase of f.

$$\nabla f = \frac{\partial f}{\partial q} = \left[\frac{\partial f}{\partial q_1}, \dots, \frac{\partial f}{\partial q_n}\right] \tag{33}$$

The gradient of the collision may be computed using $$\frac{\partial f}{\partial q} = \frac{\partial f}{\partial d}\frac{\partial d}{\partial q} \tag{34}$$

The partial derivative of f with respect to d is $$\frac{\partial f(q)}{\partial d} = -\rho e^{-\alpha d} d^{-\beta} (\beta d^{-1} + \alpha) \tag{35}$$

The partial derivative of d with respect to q is $$\frac{\partial d}{\partial q} = \frac{1}{d}[J_a^T(x_a - x_b) + J_b^T(x_b - x_a)]^T \tag{36}$$

where $x_a$ and $x_b$ represent position vectors indicating the Cartesian locations of the two things who collision is sought to be avoided with the constraint (e.g., segments a and b, or the segment a and the component b, or vice versa). $J_a$ and $J_b$ are the associated Jacobian matrices for a and b. The coordinates $x_a$ and $x_b$ are obtainable using collision detection software.

The elements of the vector in the collision constraint gradient function of equation 33 represent the degree to which each degree of freedom of the virtual subject influences the distance to collision. In one embodiment, collision constraint gradient functions are used to construct the weight matrix $W_f$ for use in determining the pose in light of one or more collisions constraints. $W_f$ is an n×n diagonal matrix with diagonal elements $W_{f_i}$. The diagonal elements are computed by:

$$W_{f_i} = \begin{cases} 1 + |\nabla f_i| & \text{if } \Delta|\nabla f_i| \geq 0, \\ 1 & \text{if } \Delta|\nabla f_i| < 0. \end{cases} \tag{37}$$

The term $\nabla f_i$ represent the collision constraint gradient function with respect to joint i, the term $\Delta|\nabla f_i|$ represent the change in the magnitude of the collision gradient function. A positive value of $\Delta|\nabla f_i|$ indicates the joint motion is causing the virtual subject to move toward collision while a negative value indicates the joint motion is causing the virtual model to move away from collision.

When a joint's motion causes the virtual subject to move toward collision, the associated weight factor $W_{f_i}$ becomes very large, causing the joint to slow down. When two limbs approach contact, the weight factor is near infinity and the joints contributing to motion towards collision virtually stop. If a joint's motion causes the limbs to move away from the collision, the joint's motion is unrestricted. A different collision constraint may be present in the set of constraints for each collision sought to be prevented.

Dynamic Consistency Constraint

Insight from human movement control reveals that humans may optimize their energy consumption when performing redundant tasks. That is, if the Cartesian space inputs describe a redundant joint configuration space having infinite solutions, the solution which minimizes the kinetic energy may be a suitable choice in predicting a natural human posture. Here, the dynamic consistency constraint is configured to preference the solution for the DOF vector q that minimizes (or at least reduces) the kinetic energy required to complete the task/s. The dynamic consistency constraint may also be interpreted as the solution ensures that the virtual subject is dynamically balanced when accomplishing the task/s.

The dynamics of the human body in joint-space can be written in terms of an (n×n) joint-space inertia matrix (JSIM) H(q) as:

$$\rho = H(q)\ddot{q} + c(q,\dot{q})q + \tau_g(q) + J^T f_e, \tag{38}$$

where q, $\dot{q}$, $\ddot{q}$, and τ denote (n×1) generalized vectors of joint positions, velocities, accelerations and forces, respectively. C is an (n×n) matrix such that $C\dot{q}$ is the (n×1) vector of Coriolis and centrifugal terms, $\tau_g$ is the (n×1) vector of gravity terms, and $f_e$ is the external spatial force acting on the system.

Solving the inverse differential kinematic model of equation 17 approximates a determination of the minimum instantaneous weighted kinetic energy of the virtual subject since the sum of squares of joint velocities are minimized. To improve upon this determination of the minimum instantaneous kinetic energy, the set of constraints includes dynamic consistency weight matrix $W_d$ including diagonal coefficients corresponding to diagonal elements of the joint space inertia matrix H(q). $W_d$ may be expressed as:

$$W_d = \text{diag}(H(q)) - I. \tag{39}$$

where I is the identity matrix. In practice, the impact of dynamic consistency weight matrix $W_d$ is a penalization of joint motion that displace a segment having a large mass and/or inertia, for example the torso.

The forces used to generate motions can provide useful information for evaluating designs. In one embodiment, H(q) can be solved to determine the average absolute power required to actuate all joints the duration of a motion (e.g., for the duration of a task) to determine the energetic cost of that motion.

$$P_{tot} = \frac{1}{N_s} \sum_{j=1}^{N_s} |\tau_j^T||\dot{q}_j| \tag{40}$$

Manipulability Metric Determination

The manipulability system 108 is configured to determine one or more manipulability metrics in order to evaluate the feasibility of a design. Manipulability metrics can be determined for each point in space on the path of completion of task. Often this is the endpoint, however this is not necessarily the case. Generally, manipulability metrics are determined by combining a differential kinematics equation and a static equilibrium equation. The differential kinematics equation is, generally:

$$v = J\dot{q} \quad (11)$$

This is repeated from equation (11) above. The differential kinematics equation provides a mapping between joint variables and task variables. The static equilibrium equation is:

$$\tau = J^T f_e \quad (41)$$

The static equilibrium equation provides the relationship between the external force $f_e$ applied to the task and the torque T applied to the joints. Note that both equations incorporate a Jacobian operation.

The manipulability metrics are numerical indices that provide a numerical value for the ability of the subject to influence velocity, force, and acceleration while executing the tasks. Examples of possible manipulability metrics include velocity, force, and dynamic (or acceleration). The numerical value of the manipulability metric represents the relative ease or difficulty the subject will experience in attempting to affect the force, velocity, or acceleration of a component of the design as part of a task. Generally, a design will be feasible if tasks are accomplished easily or with a specified amount of difficulty by a subject within a certain subject size range, and a design will be infeasible if tasks are unable to be completed by a subject or it is too difficult for a subject to complete tasks. Exactly what constitutes feasibility is left up to the designer of the design, the difficulty or ease desired out of tasks tested, and the sizes of subjects considered.

Generally, the manipulability metrics are determined by combining the static equilibrium equation with the differential kinematics equations, and using a Jacobian. These two equations will have different terms depending upon which metrics is being determined. The Jacobian used may be the same as was determined for determining posture, or it may be independently and differently derived. The determination of each metric individually is further described below.

Velocity and Force Manipulability Metrics

The manipulability metrics for force and velocity are determined with respect to a unit sphere in joint velocity space and in joint torque space, respectively. Regarding velocity, the joint velocity unit sphere is as follows:

$$\dot{q}^T \dot{q} = 1 \quad (42)$$

This can be mapped to an ellipsoid in task velocity space by substituting the differential kinematic equation 11 above, to obtain:

$$v^T (JJ^T)^{-1} v = 1 \quad (43)$$

This ellipsoid in task velocity space represents the points on the surface of an ellipse, which is referred to an as a velocity manipulability ellipsoid.

Regarding force, the unit sphere in joint torque space is as follows:

$$\tau^T \tau = 1 \quad (44)$$

This can be mapped to an ellipsoid in force space by substituting the static equilibrium equation 41 above, to obtain:

$$f_e^T (JJ^T) f_e = 1 \quad (45)$$

This ellipsoid in force space represents the forces on the components of the design being manipulated as part of the task, also referred to as end-effecter forces. This ellipsoid is referred to as a force manipulability ellipsoid. For a given human posture, the force manipulability ellipsoid characterizes the forces that can be generated upon the components of the design by a virtual subject applying a given set of joint torques.

The shape and orientation of both the force and velocity ellipsoids are determined using either matrix core $(JJ^T)$ or its inverse $(JJ^T)^{-1}$, both of which are a function of the Jacobian J is determined based on posture. The Jacobian term J may be the same as the Jacobian used to determine posture, or it may be different. For example, a model's hand position and its associated Jacobian in a handbrake pull task can be used for determining both posture and manipulability. As another example, two different tasks may be used in determining posture, for example based on a pelvis position and a hand position. Thus, the Jacobian for posture will incorporate both tasks. However, hand manipulability may not need to take into account pelvis position, resulting in a different Jacobian.

The ellipsoids' principal axes (e.g., the major and minor axes) lie along the eigenvectors of these matrix cores. Thus, the principal axes of the force manipulability ellipsoid coincide with the principal axes of the velocity manipulability ellipsoid. However, because the force manipulability ellipsoid uses $(JJ^T)$ and the velocity manipulability uses its inverse $(JJ^T)^{-1}$ the length of the principal axes for the force velocity ellipsoid are inversely proportional to the principal axes for the velocity manipulability ellipsoid.

Figure 6:
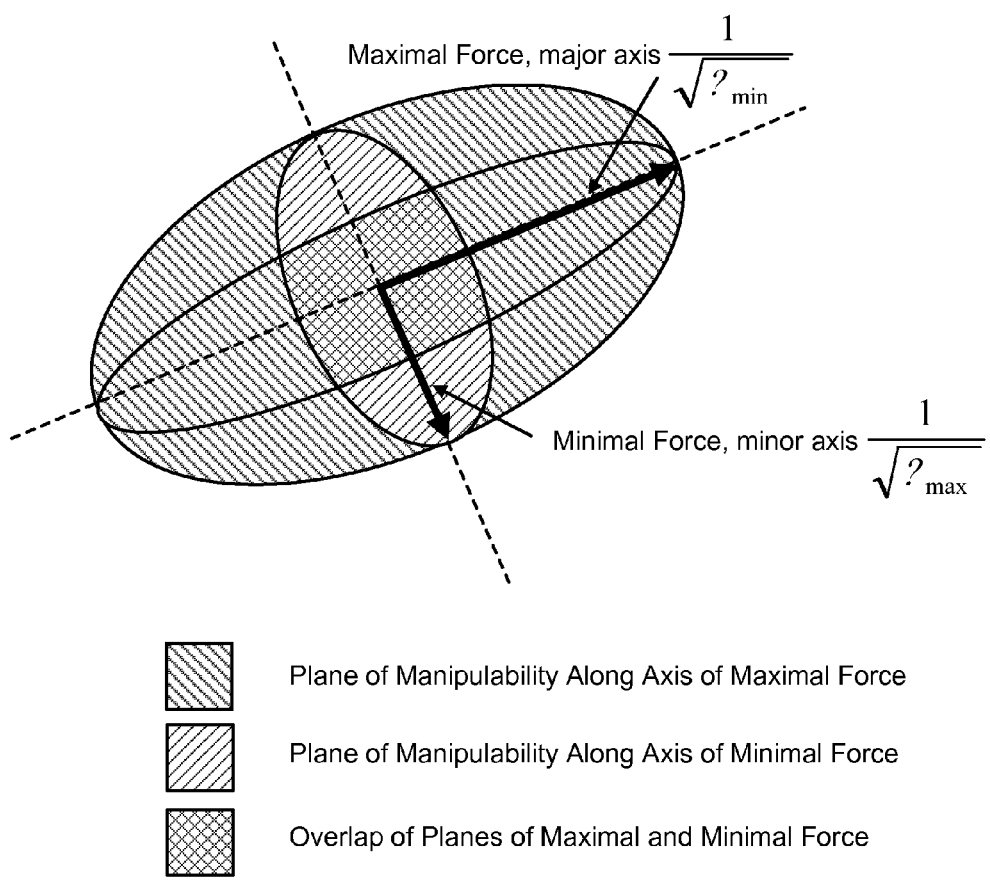
FIG. 6 is an example force manipulability ellipsoid, according to one embodiment.

For the force manipulability ellipsoid, the length of a principal axis j is given by $1/\sqrt{\lambda_j}$ where $\lambda_j$ is an eigenvalue associated with eigenvector j. The largest eigenvalue corresponds to the length of the minor axis of the ellipsoid, and the smallest value corresponds to the length of the major axis. FIG. 6 is an example force manipulability ellipsoid 600, according to one embodiment. The outer surface of the force manipulability ellipsoid represents the most force that can be applied to the components of the task in a given direction. The direction along which maximal force can be applied, relative to any other direction, is along the major axis. Stated differently, effort of the subject exerted as an applied torque is most effectively converted into an endpoint force on a component of the design when directed along the major axis. Conversely, the minor axis indicates the direction in which applied torques are least effective.

Figure 7:
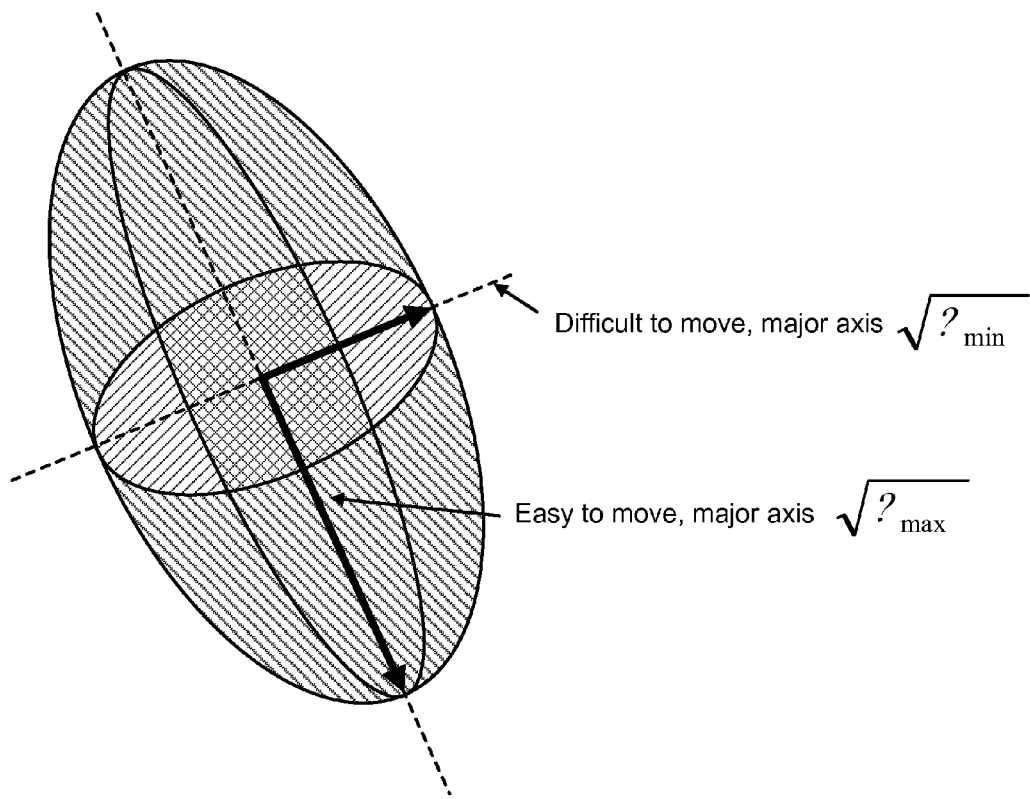
FIG. 7 is an example velocity manipulability ellipsoid, according to one embodiment.
Figure 7:
Figure 7:
Figure 7:

For the velocity manipulability ellipsoid, the length of the major and minor axis are inverses of the force manipulability ellipsoid, given by $\sqrt{\lambda_j}$ for eigenvalue $\lambda_j$. The largest eigenvalue corresponds to the length of the major axis and the smallest eigenvalue corresponds to the length of the minor axis. FIG. 7 is an example velocity manipulability ellipsoid 700, according to one embodiment. The outer surface of the velocity manipulability ellipsoid represents the velocities that can be achieved by the component of the design.

Figure 8:
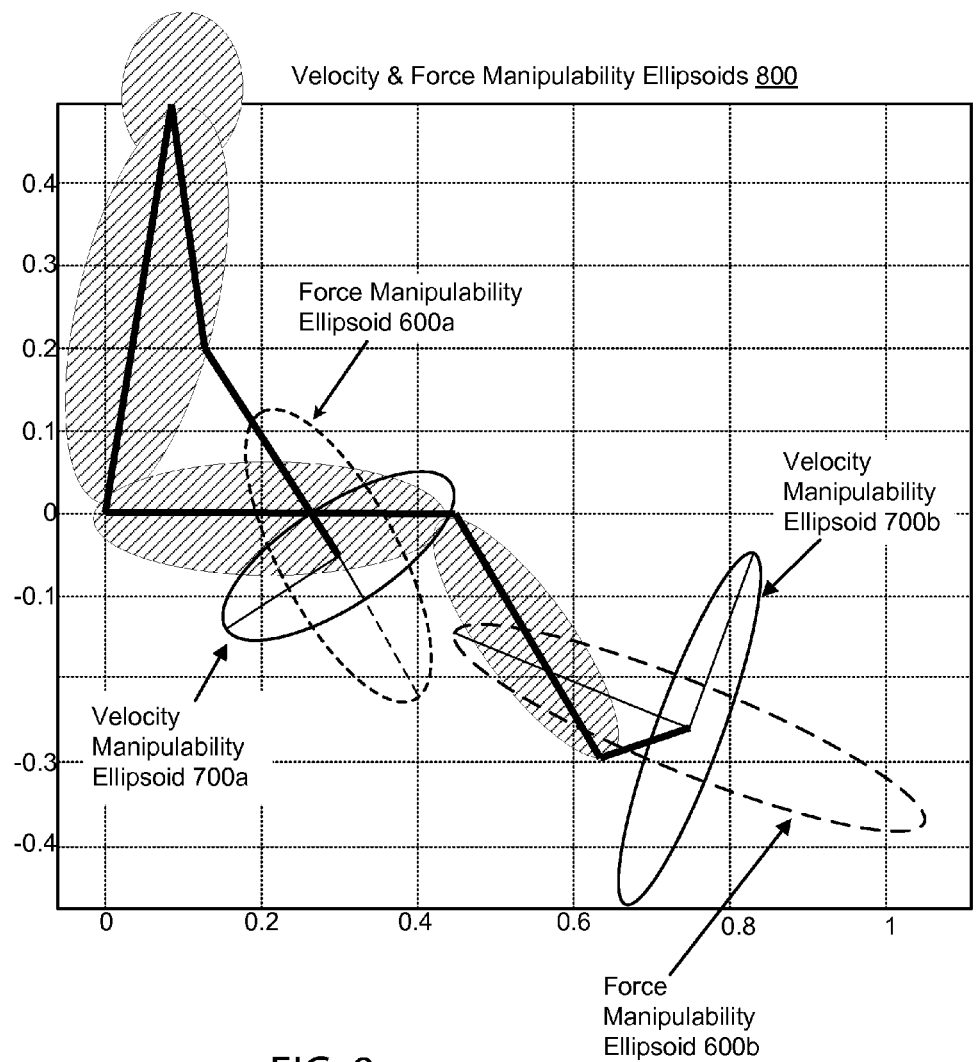
FIG. 8 is an example illustration of the force and velocity manipulability ellipsoids of a virtual subject accomplishing multiple virtual tasks in a design, according to one embodiment.
Figure 9:
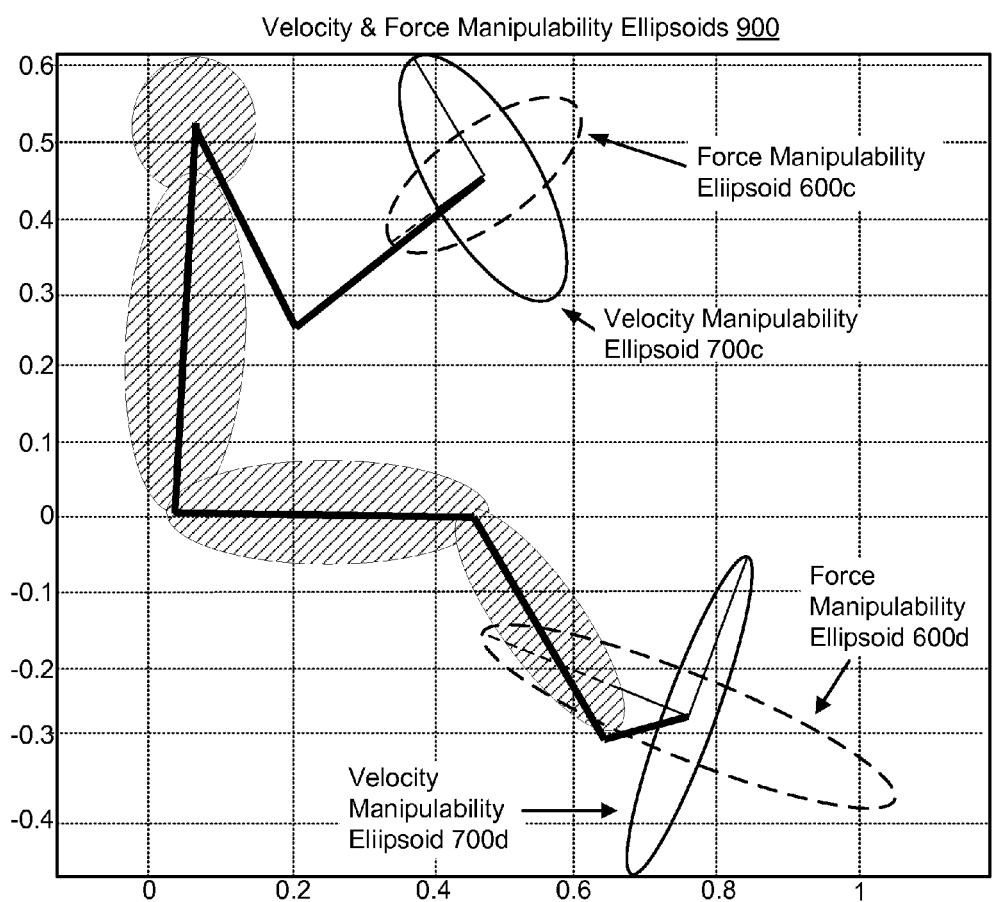
FIG. 9 is another example illustration of the force and velocity manipulability ellipsoids of a virtual subject accomplishing multiple virtual tasks in a design, according to one embodiment.

Comparing the force and velocity manipulability ellipsoids to each other, a direction along which a high velocity may be obtained is a direction along which only a low force can be obtained and vice versa. This can be interpreted as the subject being a mechanical transformer between velocities and forces between the joint space and task space. FIGS. 8 and 9 illustrate this relationship between the force and velocity manipulability ellipsoids. FIG. 8 is an example illustration of two different force 600a, 600b and velocity 700a, 700b manipulability ellipsoids of a virtual subject accomplishing multiple virtual tasks in a design, according to one embodiment. FIG. 9 is another example illustration of two different force 600c, 600d and velocity 700c, 700d manipulability ellipsoids of a virtual subject accomplishing multiple virtual tasks in a design, according to one embodiment.

To determine a force manipulability metric and a velocity manipulability metric, start with a unit vector u emanating from a center of a manipulability ellipsoid along a specified direction. The vector u represents the particular direction to apply a force or motion at the location of a task (e.g., at any point between the starting point of the task and the end point of the task). The vector u can be obtained from the subject, arbitrarily defined, or provided as part of a task that specifies what vectors u are capable of completing the task.

The value of a manipulability metric is determined based on the intersection of the vector u with the surface of the corresponding manipulability ellipsoid. Thus, the force manipulability metric $\alpha_f$ is based on the intersection of vector u with the surface of the force manipulability ellipsoid, and the velocity manipulability metric $\alpha_v$ is based on the intersection of the vector u with the velocity manipulability ellipsoid. More specifically, these metrics are determined by:

$$\alpha_f = (u^T J J^T u)^{-1/2} \quad (46)$$

$$\alpha_v = (u^T (JJ^T)^{-1} u)^{-1/2} \quad (47)$$

A subject may be asked to complete multiple tasks simultaneously, and the tasks may require different parts of the subject's body. Manipulability metrics may be determined separately for each tasks. FIGS. 8 and 9 illustration example force and velocity manipulability ellipsoids of a virtual subject accomplishing multiple, different virtual tasks in a design, according to one embodiment.

Dynamic Manipulablity Ellipsoid

The dynamic (or acceleration) manipulability metric represents the capability of the subject to impose accelerations on a component of the design. The dynamic manipulability metrics is determined based on a dynamic manipulability ellipsoid. The dynamic manipulability ellipsoid is based on two dynamic equations describing the motion of the subject in joint space. The first dynamic equation is an extension of the static equilibrium equation 41 introduced above:

$$\tau = H(q)\ddot{q} + C(q,\dot{q})\dot{q} + \tau_g(q) + J^T f_e \quad (48)$$

where the extra terms account for dynamic effects. For example, q, $\dot{q}$, $\ddot{q}$, and $\tau$ denote (n×1) generalized vectors of joint position, velocity, acceleration, and force variables, respectively. H(q) is an (n×n) joint-space inertia matrix. C is an (n×n) matrix such C$\dot{q}$ is the (n×1) vector of Coriolis and centrifugal terms. $\tau_g$ is the (n×1) vector of gravity terms.

Based on this equation, the joint accelerations can be determined using:

$$\ddot{q} = H^{-1}(\tau - C(q,\dot{q})\dot{q} - \tau_g(q) - J^T f_e) \quad (49)$$

The second equation is the differential kinematics equation relating joint space and operational space accelerations. This equation is the derivative of equation 11 introduced above (e.g., $a = \dot{v}$):

$$a = j\ddot{q} + \dot{j}\dot{q} \quad (50)$$

Combining the static and dynamic equations, we arrive at:

$$a = JH^{-1}\tau + a_{bias} \quad (51)$$

where the bias term considers the effects of accelerations from velocity and gravity.

$$a_{bias} = a_{vel} + a_{grav} \quad (52)$$

$$a_{vel} = \dot{J}\dot{q} - JH^{-1}C\dot{q} \quad (53)$$

$$a_{grav} = JH^{-1}(\tau_g(q) + Jf_e) \quad (54)$$

where the bias term considers the effects of accelerations from velocity and gravity. In one embodiment, it is assumed that the subject's joints have constant and symmetrical joint limits. In another embodiment, no such assumption is made, and the 2n inequality constraints (two limits for each of n joints) for the joint torques are:

$$-\tau_i^{lim} \leq \tau_i \leq +\tau_i^{lim} \ i=1,\ldots,n \quad (55)$$

The normalized joint torques are modeled as $$\tilde{\tau} = S^{-1}\tau \quad (56)$$

where $S = \text{diag}(\tau_1^{lim}, \ldots, \tau_n^{lim})$ is a scaling matrix. Similarly to the force and velocity manipulability metrics, the dynamic manipulability ellipsoid is determined based on a sphere, in this case however it is an n dimensional sphere defined by $$\tilde{\tau}^T\tilde{\tau} \leq 1 \quad (57)$$

This sphere can be mapped to an m dimensional dynamic manipulability ellipsoid determined by:

$$(a - a_{bias})^T J^{-T} Q J^{-1} (a - a_{bias}) \leq 1 \quad (58)$$

where $$Q = HS^{-2}H \quad (59)$$

The shape of the dynamic manipulability ellipsoid is determined by the matrix core $J^{-T}QJ^{-1}$. The eigenvectors of the matrix core correspond to the principal axes of the ellipsoid, the lengths of which are given by $1/\sqrt{\lambda_j}$ where is the corresponding eigenvalue $\lambda_j$. When there is inherent redundancy with respect to the execution of operational tasks, that is, when there are multiple configurations of joints that can achieve a task, the Jacobian Inverse $J^{-1}$ is replaced by a weighted right pseudo-inverse given by:

$$J^+ = W^{-1}J^T(JW^{-1}J^T)^{-1} \quad (60)$$

where $W = HS^{-1}H$ is a weight matrix that accounts for both inertia and torque limits. More specifically, the weight matrix W may be the same as weight matrix W from Equation 20 above. In this redundant case, the shape of the dynamic manipulability ellipsoid is determined by the eigenvectors and eigenvalues of the matrix core $J^{+T}QJ^+$. Since human models typically have many more degrees of freedom than tasks to be accomplished, the redundant case is usually applicable.

The value of the dynamic manipulability metric $\alpha_d$ is determined based on the intersection of the vector u with the surface of the dynamic manipulability ellipsoid. More specifically, the metrics is determined by:

$$\alpha_d = (u^T J^{+T} Q J^+ u)^{-1/2} \quad (61)$$

For a given posture, the dynamic manipulability metric can be used to quantify the capability of the subject to accelerate the task along direction u, while also taking into account joint torque limits.

Example Method

Figure 2:
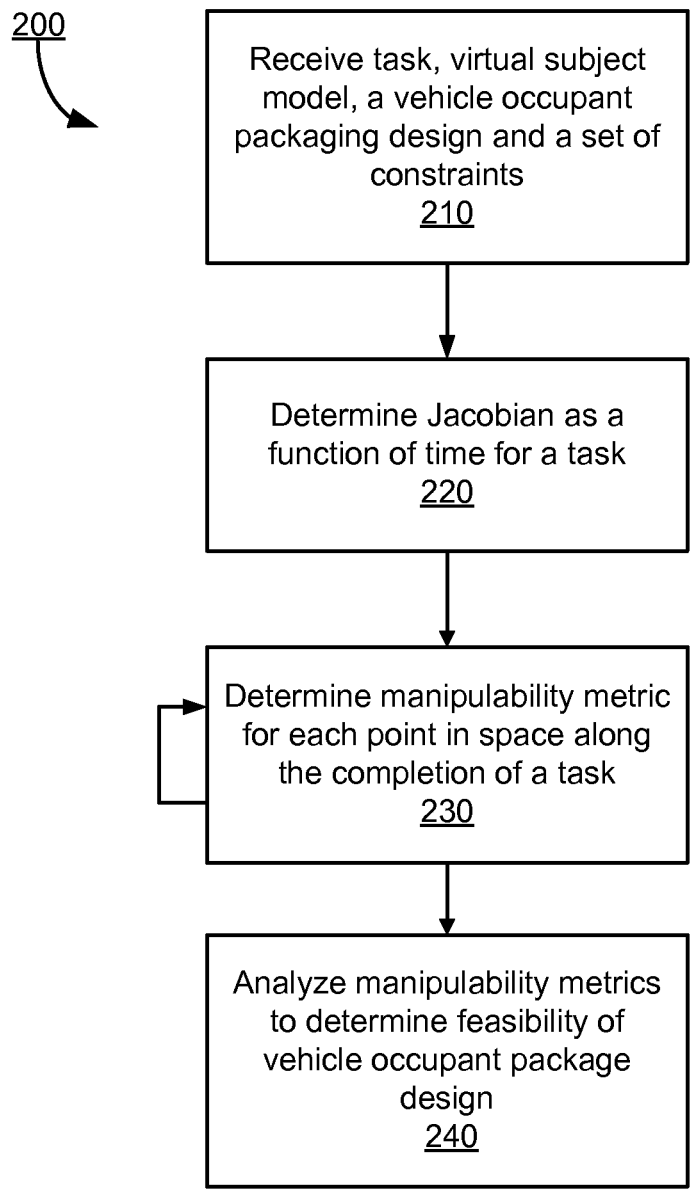
FIG. 2 is a flowchart showing exemplary processes for determining and analyzing manipulability metrics of a virtual subject carrying out a virtual task in a vehicle occupant package design, according to one embodiment.

FIG. 2 is a flowchart 200 for determining feasibility of a vehicle occupant packaging design using manipulability metrics, according to one embodiment. A computer system receives 210 at least one task, a virtual subject model including parameters, a vehicle occupant packaging design, and a set of constraints. The computer system 100 determines 220 the pose of the virtual subject throughout the carrying out the task. The determination of pose includes determining a posture for each of a number of units of time during the accomplishment of the task by the virtual subject. Thus, this determination 220 may involve repeating a posture determination for each unit of time during task accomplishment. As part of the determination of posture, the system determines a Jacobian for each time step. The computer system 100 uses the Jacobian at each time step of the task to determine 230 manipulability metrics. An aggregated manipulability metric over all time steps during completion of the task may also be determined for each point in space where a pose completes the task. The computer system 100 analyzes the manipulability metrics to determine the feasibility of the vehicle occupant package design.

Figure 4:
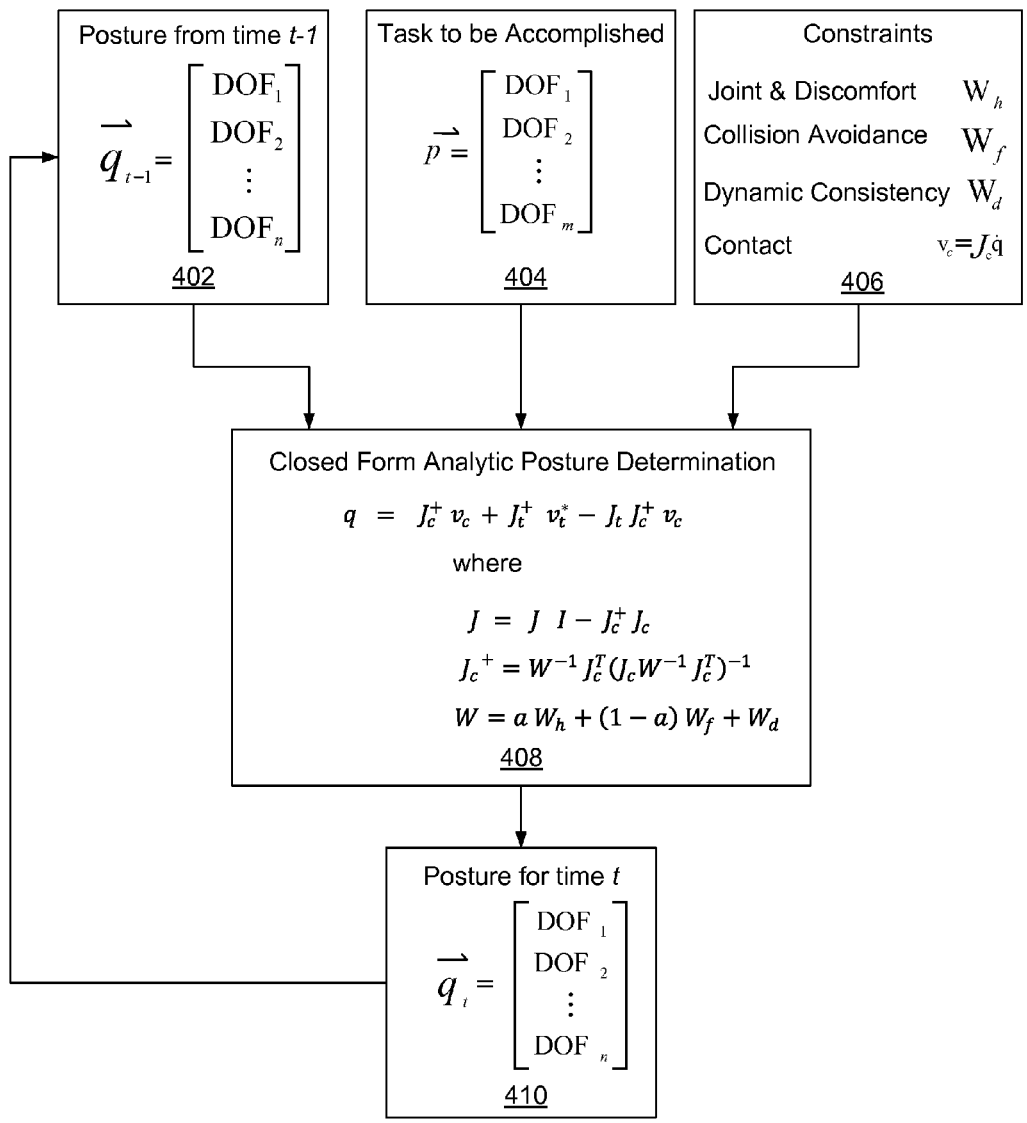
FIG. 4 is a flowchart showing exemplary processes for determining an individual posture during accomplishment of a task within a design, according to one embodiment.

FIG. 4 is a flowchart for determining an individual posture during accomplishment of a task, according to one embodiment. FIG. 4 shows one iteration of determination 220 from FIG. 2. As above, the posture determination system 104 accesses 402 a posture $q_{t-1}$ from the previous unit in time t−1. The posture determination system 104 also accesses 404 a task p to be accomplished. The posture determination system 104 also accesses 406 a set of constraints to be obeyed during accomplishment of the task p.

The pose determination system 104 uses these inputs to determine 408 the posture $q_t$ 410 for the next unit in time t. Part of this determination 408 includes determination of a Jacobian J and/or $J_c$. The posture $q_t$ 410 for time t may be collected along with the other determined postures for output to the analysis system 106. Additionally, the posture $q_t$ 410 for time t is fed back into the pose determination system 104 for determination of the posture $q_{t+1}$ (not shown) for the next instant in time. This process is repeated until the task is completed, or until the set of constraints can no longer be obeyed. If the constraints are violated, rather than returning a complete pose, the pose determination system 104 may error out and indicate that the task cannot be accomplished by the virtual subject.

Figure 5:
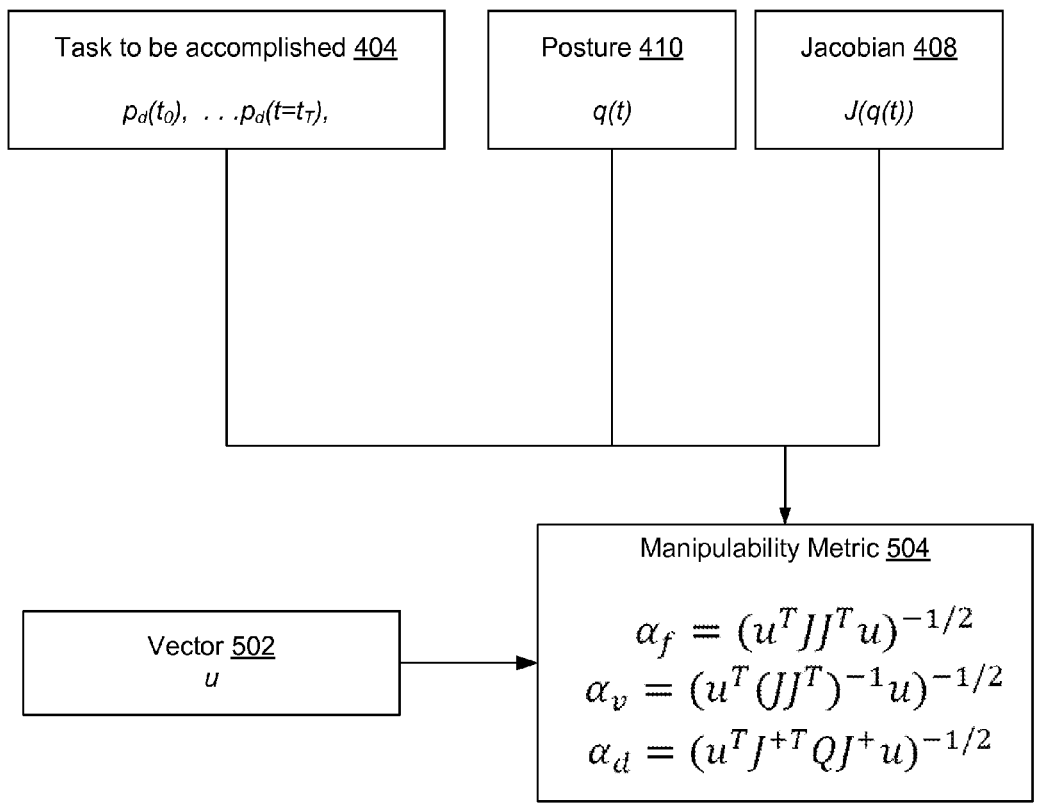
FIG. 5 is a flowchart showing exemplary processes for determining a set of manipulability metrics corresponding to a point in time along the completion of a task, according to one embodiment.

FIG. 5 is a flowchart for determining a set of manipulability metrics corresponding to a point in time along completion of a task, according to one embodiment. The inputs to the manipulability metric determination 504 may be any point in time along the completion of the task 404 including the endpoint/s as provided by p, the posture q 410 at that point in time, and the Jacobian J 408 calculated for the posture for that point in time. Also input is the vector u 502. The set of manipulability metrics includes one or more manipulability metrics, for example a force manipulability metric $\alpha_f$, a velocity manipulability metric $\alpha_v$, and a dynamic manipulability metric $\alpha_d$.

Figure 10:
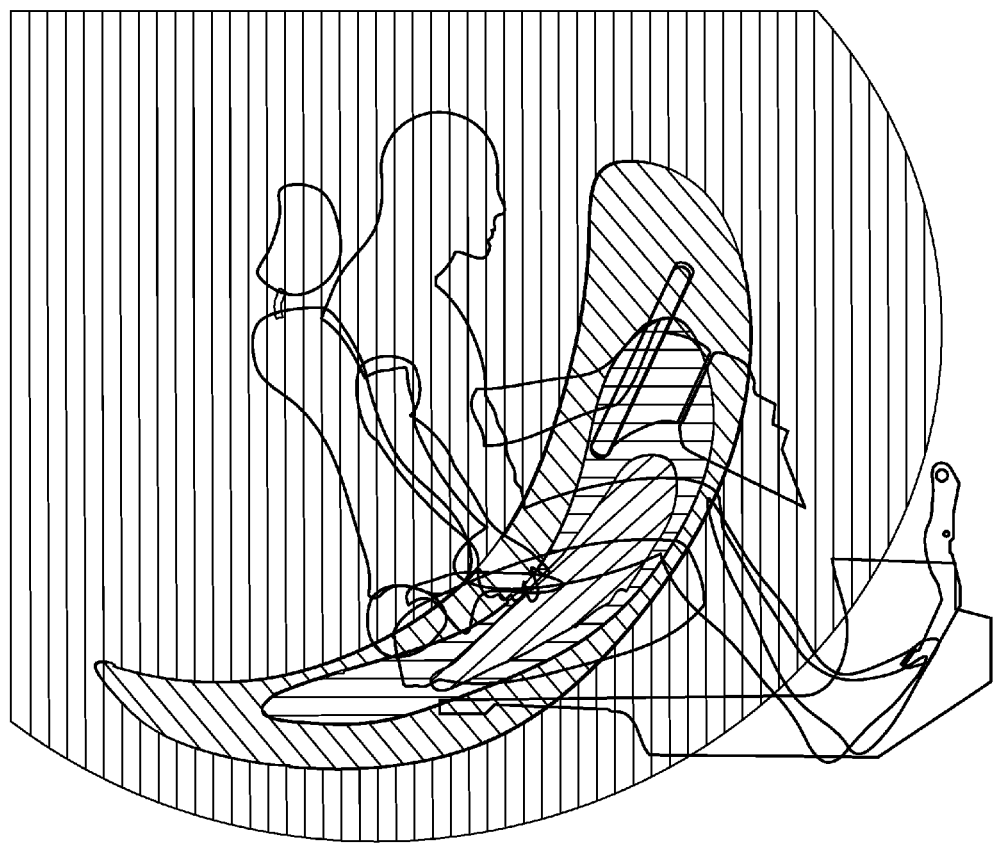
FIG. 10 is an exemplary plot of a manipulability metric as a function of position within a design along one plane, in order to evaluate design feasibility in accomplishing the task of pulling the handbrake of a vehicle, according to one embodiment.
Figure 10:
Figure 10:
Figure 10:
Figure 10:

FIG. 10 is a plot of a manipulability metric as a function of position within a design along one plane, in order to evaluate design feasibility in accomplishing the task of pulling the handbrake of a vehicle, according to one embodiment. In the example of FIG. 10, the values of the manipulability metrics at various task endpoints in the plane have been grouped numerically into one of four ranges, a first range 1010 representing an endpoint that is infeasible for completing a task, a second range 1020 representing an endpoint that is able to be completed but with extreme discomfort to the subject (e.g., being at the end of the range of motion of their joints or requiring a large amount of force to achieve such a position), a third range 1030 representing an endpoint for task completion that is able to be completed with only relatively minor discomfort for the subject, and a fourth range 1040 representing an endpoint for task completion that is comfortable for the subject. Manipulability is directly correlated with physical comfort.

An infeasible endpoint is one in which the endpoint location is unreachable. In one embodiment, unreachable endpoints can be determined if the Jacobian at the endpoint is rank deficient. In another embodiment, unreachable endpoints can be the result of physical constraints (constraints in the environment or constraints in the kinematic structure).

Interactive Vehicle Package Design System

In some embodiments, system and methods for interactive vehicle package design (i.e., interactive vehicle packaging design) can utilize performance simulation and prediction in execution of tasks as discussed above. Interactive vehicle package design allows a user to dynamically create and modify vehicle package designs using analysis of human physical interaction. The interactive vehicle package design can be implemented in real time with analysis of skeletal mechanics (e.g., joint kinematics and inverse dynamics) of a virtual human subject. The interactive vehicle package design can also be implemented with analysis of muscle mechanics (e.g., joint kinematics and forward dynamics) of a virtual human subject. The analysis can be performed for different locations of the task and/or for different positions of the virtual human subject. For example, for a number of different endpoints of the task in a three-dimensional coordinate space or for each endpoint of the virtual human subject along a trajectory to the endpoint of the task. Further, the vehicle package design and virtual human subject can be tailored to specific parameters for customized vehicle package design for a specific virtual human subject.

Figure 11:
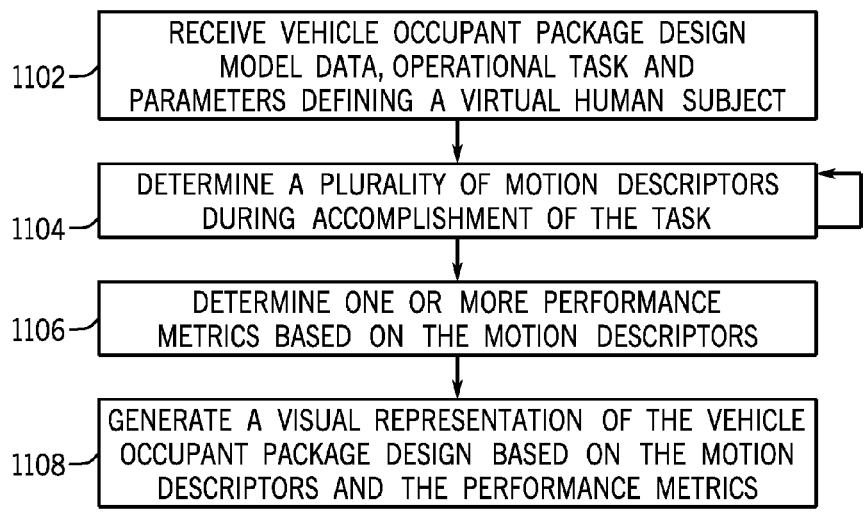
FIG. 11 is a flowchart showing exemplary processes for a method of interactive vehicle package design, according to one embodiment.

Referring now to FIG. 11, a computer-implemented method for interactive vehicle package design will now be described with reference to the components of FIGS. 1-10. The method of FIG. 11 can be implemented with the computer system 100 of FIG. 1. At block 1102, the method includes receiving vehicle occupant package design model data including a task to be executed. The task is a physical task to be carried out (i.e., accomplished through motion) by a virtual human subject within the vehicle package design. For example, pulling an emergency handbrake, opening or closing a vehicle door, adjusting a vehicle seat, pulling a vehicle clutch, among others. Referring to FIGS. 15A, 15B, 15C and 15D, an illustrative example of a virtual human subject 1502 executing the task of pulling an emergency handbrake 1504 is shown. The illustrative examples discussed herein will refer to the task of pulling an emergency handbrake, however, other tasks can also be implemented.

In one embodiment, the vehicle occupant package design model data including the task to be executed is a high-level description of the task. For example, and as will be described in further detail herein with FIG. 14, the task to be executed can be identified as a high-level description of the task received from a user input. For example, a user can identify the task as "pulling an emergency handbrake" through an input/output device. Based on the high-level description of the task, other vehicle occupant package design model data can be received, for example, from a user input, retrieved from a database based on the high-level description of the task and/or determined based on the high-level description of the task. Vehicle occupant package design model data can include a number of components associated with the task to be executed. For example, a seat having a length and height, a headrest, a steering wheel, pedals (e.g., gas, brake, and clutch), a handbrake, an audio/video system located in a center console, instrument sticks (e.g., to control lights and wiper blades), and a dashboard. This list of components is merely exemplary and is not meant to be exhaustive. The design also includes sizes (e.g., proportions) for components, as well as relative distances, absolute positions, and orientations between the various components. For example, the distance between the steering wheel and the seat, and between the pedals and the seat may also be included in the design.

Figure 15A:
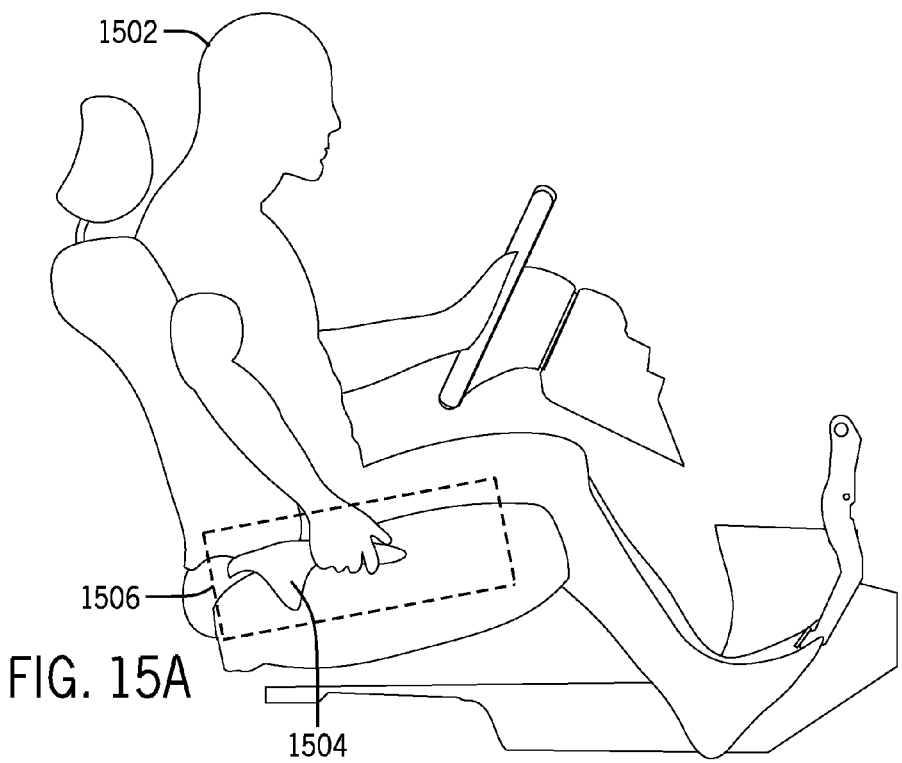
FIGS. 15A-15B are illustrative examples of a visual representation of a vehicle occupant package design, according to one embodiment
Figure 15B:
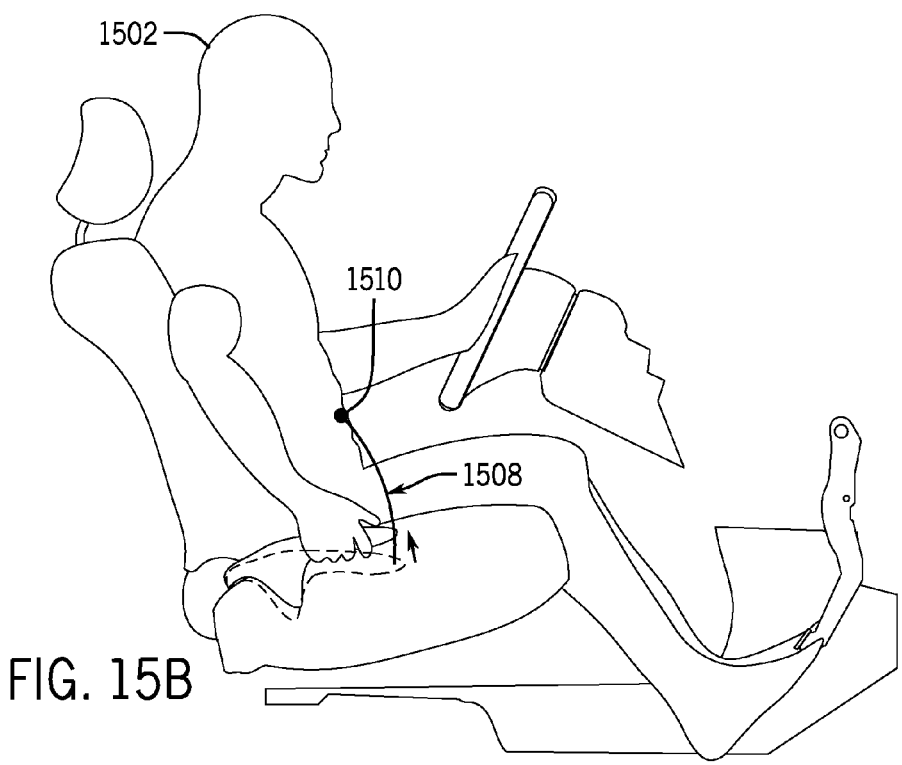
Figure 15C:
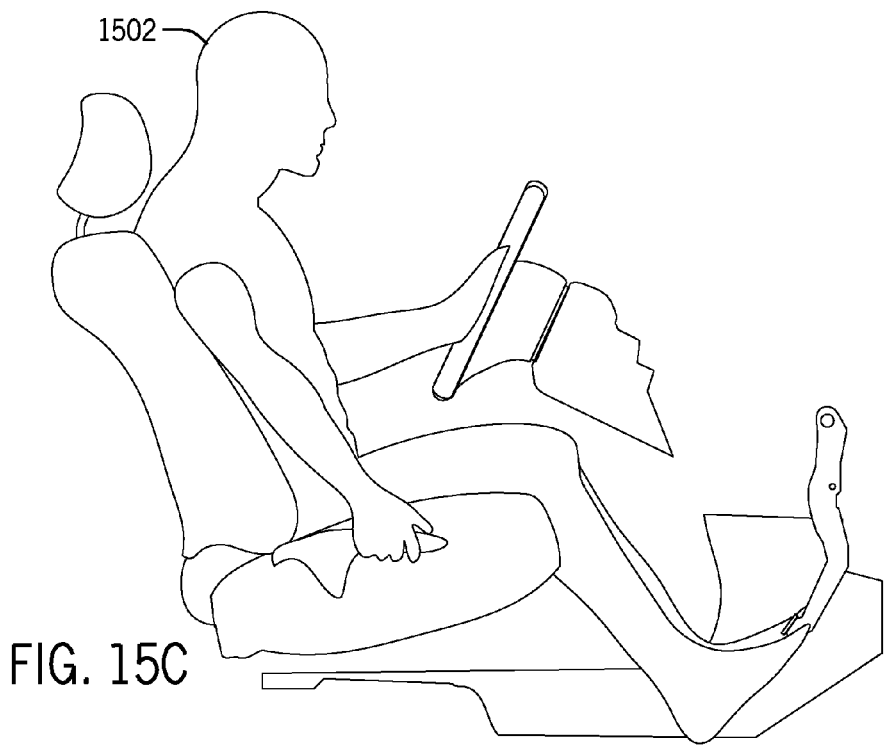
FIGS. 15C-15D are illustrative examples of a visual representation of a vehicle occupant package design, according to one embodiment.
Figure 15D:
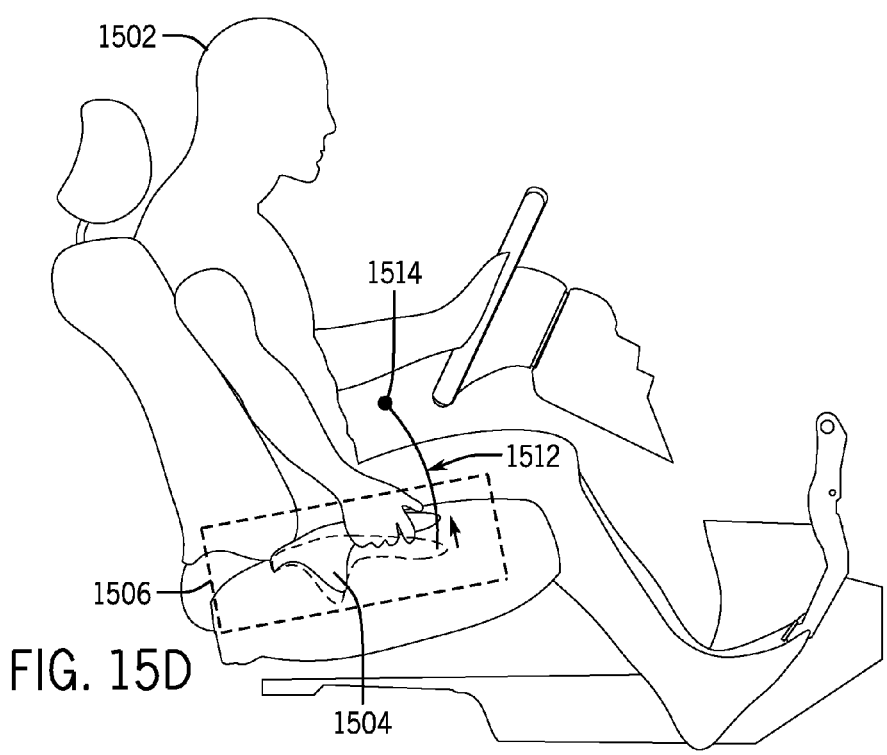

The design may also include ranges of possible positions for the various components. For example, in many designs the seat may be raised or lowered, tilted, or moved forward or backward within the frame of the cockpit as a whole. Similarly, the steering wheel may be moved forward or backward or raised or lowered. Being able to reposition and reorient these components greatly affects the usability of a particular vehicle occupant packaging design by different segments of the human population. Specifically, ranges of possible positions for various components can be defined within a task space boundary. A task space boundary is a three dimensional coordinate space and defines a volume for executing the task. Thus, the task space boundary can identify one or more possible locations for one or more components of the design. Referring again to the illustrative example, the task of pulling an emergency handbrake 1504 can include a task space boundary 1506 defining a volume where one or more locations (e.g., positions) in which the emergency handbrake can be located. In FIG. 15B, the location of the emergency handbrake 1504 is slightly forward of the location of the emergency handbrake 1504 in FIG. 15A.

Referring again to FIG. 11, block 1102 can also include receiving parameters defining a virtual human subject for executing the task, wherein the virtual human subject includes a plurality of degrees of freedom. As discussed above, FIG. 3 is an example illustration of an articulated model of a virtual human subject according to one embodiment. In the example of FIG. 3, the virtual subject is defined by a number of features on the body including, for example, a head top, a right and left shoulder, a right and left elbow, a waist, a right and left wrist, a right and left hip, a right and left knee, and a right and left ankle. Generally, features are located at or near joints that can rotate about one or more axes. The axes around which a joint can rotate are referred to as degrees of freedom. A given joint may have more than one degree of freedom. For example, the human elbow can rotate about two axes, and thus has two different degrees of freedom. One degree of freedom is associated with flexion/extension and a second degree of freedom associated with pronation and supination. Collectively, the angles of the degrees of freedom of the virtual subject and the parameters fully specify the static positioning of all limbs of the virtual subject. This is also referred to as a posture.

As discussed above, parameters defining the virtual human subject, in one example, represent one or more thresholds within human population as a whole. Specifically, parameters can include age, gender, ethnicity, body muscle index, or other characteristics that can affect muscle or skeletal mechanics. This is allows for human analysis based on age-related changes in muscle or skeletal mechanics. In one embodiment, the virtual human subject model is scaled according to the parameters defining the virtual human subject. For example, the articulated model in FIG. 3, representing a virtual human subject model, may be scaled to an age, height, and/or weight as defined according to the parameters. In one embodiment, the articulated model of the virtual human subject is a muscle model. For example, the muscle model can be determined or scaled as an elderly muscle model for an age threshold of 85. Accordingly, upon receiving the parameters defining the virtual human subject, the virtual human subject is scaled so that the computer system 100 can determine performance metrics of the vehicle occupant package design (e.g., feasibility, comfort, effort, efficiency) for a specific virtual human subject. The parameters defining the virtual human subject can be received, for example, from a user input, retrieved from a database and/or determined based on one of a user input or the task.

Referring again to FIG. 11, block 1104 includes determining a plurality of motion descriptors of the virtual human subject including determining a manipulation over time of the degrees of freedom of the virtual human subject during accomplishment of the task. In one embodiment, the method includes determining one or more endpoints of motion of the task, for example, for one or more locations identified in the task space boundary, and for each endpoint of motion of the task, a motion path (i.e., a trajectory), indicating an endpoint direction of motion of a path the virtual human subject used to accomplish the task (i.e., the path to the endpoint motion of the task). Accordingly, in one embodiment, determining a plurality of motion descriptors of the virtual human subject includes determining a manipulation over time of the degrees of freedom of the virtual human subject for any endpoint of the virtual human subject along a motion path during accomplishment of the task. Said differently, the motion descriptors can be determined for any endpoint on the virtual human subject at any instance in time based on the location of the endpoint in the motion path and the direction of motion of the endpoint. The motion descriptors can also be determined for one or more endpoints of motion of the task (including one or more endpoints of motion of the task for one or more locations identified in the task space boundary).

Specifically, determining the plurality of motion descriptors of the virtual human subject can be accomplished by determining a Jacobian between the degrees of freedom and the task for any endpoint during accomplishment of the task. The Jacobian is determined for any endpoint on the motion path to the endpoint of the task during accomplishment of the task. The motion descriptors include a posture and a pose of the virtual human subject for any endpoint during accomplishment of the task. As discussed above, the posture initialization system 102 is configured to determine an initial posture of the virtual subject using the design model data, the parameters defining the vehicle human subject, the task to be accomplished and a set of constraints. Using the initial posture, the pose determination system 104 is configured to determine the pose of the virtual subject as the virtual subject carries out the one or more specified tasks while also adhering to the set of constraints. As part of the determination of a posture, the pose determination system 104 determines a Jacobian that is used to move the subject between one time step and the next in accomplishing the task.

Referring again to FIG. 11, block 1106 includes determining one or more performance metrics based on the motion descriptors. The performance metrics and other metrics based on the performance metrics (i.e., a performance index discussed below) indicate the effort a task will required, the efficiency of the task, the comfort level during accomplishment of the task, the feasibility of the task and/or vehicle package design, among others, for any endpoint on the virtual human subject in accomplishing the task given the endpoint position in a motion path of the task, an endpoint direction of motion and an instance in time. In one embodiment, the performance metrics can include, but are not limited to, the manipulability metrics discussed above. Specifically, the pose of the virtual subject in carrying out the tasks is analyzed to determine the manipulability metrics used to determine the feasibility (or usability) of the design for potential drivers and/or passengers matching the size and shape of the virtual subject. The manipulability system 108 is configured to make use of the Jacobian determined as part of the pose, the task to be accomplished, a particular endpoint of direction of motion indicating the path the virtual human subject used to accomplish the task. As discussed above, examples of manipulability metrics include: a force metric quantifying the subject's ability apply a joint torque as a force to a component of the design (e.g., equations 44, 45 and 46), a velocity metric quantifying the subject's ability to cause the component to achieve velocity (e.g., equations 42, 43, 47), and a dynamic metric quantifying the subject's ability to cause the component to achieve acceleration (e.g., equations 48, 49, 50, 51).

Figure 12:
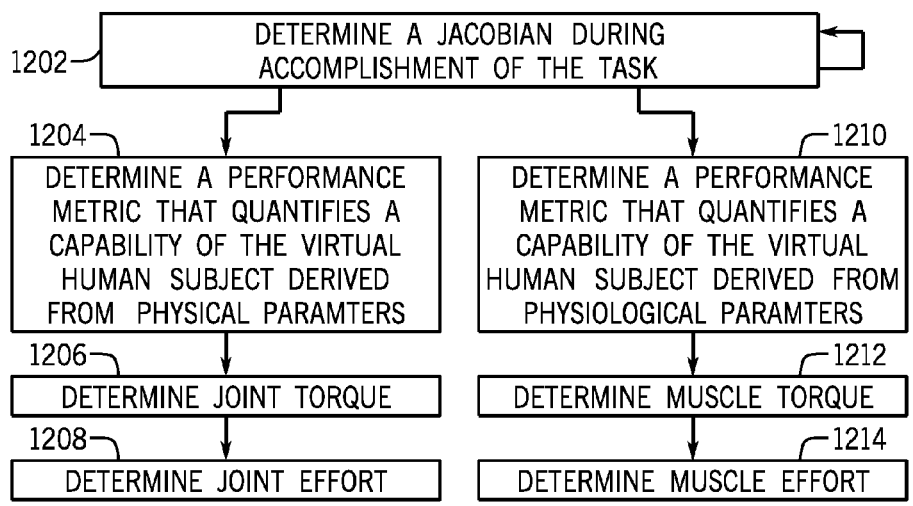
FIG. 12 is a flowchart showing exemplary processes for determining a plurality of performance metrics, according to one embodiment.

In a further embodiment, the one or more performance metrics quantify a capability of the virtual human subject to accomplish the task based on physical parameters of the virtual human subject. Referring now to FIG. 12, a method is illustrated for determining a one or more performance metrics based on the motion descriptors. At block 1204, the method includes determining one or more performance metrics that quantifies a capability of the virtual human subject based on physical parameters. Specifically, said performance metrics can be determined in real-time as an analysis of skeletal mechanics (e.g., joint mechanics) and, in some embodiments, does not include analysis of muscle mechanics. At block 1206, the method includes determining joint torque and at block 1208 determining joint effort to produce said joint torque. The Jacobian determined as part of the pose is used to determine the joint torque and the joint effort to produce said joint torque. Accordingly, performance metrics based on physical parameters (e.g., joint torque, joint effort), can be determined at any endpoint on the motion path to the endpoint of the task during accomplishment of the task. In one embodiment, blocks 1206 and 1208 are determined using joint kinematics and inverse dynamics based on the kinematics as discussed above.

In another embodiment, the one or more performance metrics that quantify a capability of the virtual human subject to accomplish the task based on physical parameters of the virtual human subject can include mechanical power index, total mechanical energy index, kinetic energy index, effort index, among others. The performance metrics utilize the Jacobian determined as part of the pose and posture during accomplishment of a task.

The mechanical power index is determined based on the torque $\tau$ at a joint i and the angular velocity $\omega$ at joint i. The mechanical power index describes the joint effort of a particular joint at an endpoint along the path of motion to the endpoint direction of motion. More specifically, the mechanical power index is determined by:

$$P_{Joint\ Power} = |\tau_i \cdot \omega_i| \qquad (62)$$

The total mechanical energy index is determined as a sum involving all of the joints. More specifically, the total mechanical energy index is determined based on equation (62) by:

$$P_{energy} = \int_{t_o}^{t_f} \Sigma_i |\tau_i \cdot \omega_i| dt \qquad (63)$$

The kinetic energy index is an approximation of the kinematic energy produced at a generalized coordinate q at an endpoint along the path of motion to the endpoint direction of motion. It is determined based on a joint space inertia matrix H(q) and joint velocities. More specifically, the kinetic energy index is determined by:

$$P_{KE} = \frac{1}{2} \dot{q}^T H(q) \dot{q} \qquad (64)$$

The effort index describes joint effort of a particular joint at an endpoint along the path of motion to the endpoint direction of motion. It is determined based on the scalar weight associated with the joint i as $W_i$ and the maximum isometric torque at joint i as $\tau_{max}$. More specifically, the effort index is determined by:

$$P_{effort} = \sum_{i=1}^{n} W_i \frac{\tau_i^T \tau_i}{\tau_{i_{max}}^2} \qquad (65)$$

In another embodiment, the one or more performance metrics quantify a capability of the virtual human subject to accomplish the task based on physiological parameters of the virtual human subject. Referring again to FIG. 12, at block 1210, the method includes determining one or more performance metrics that quantify a capability of the virtual human subject to accomplish the task based on physiological parameters of the virtual human subject. Specifically, said performance metrics can be determined as an analysis of muscle mechanics. At block 1212, the method includes determining muscle torque and at block 1214, the method includes determining muscle effort. In one embodiment, blocks 1212 and 1214 are determined using joint kinematics and forward dynamics based on the kinematics as discussed above.

Performance metrics that quantify a capability of the virtual human subject to accomplish the task based on physiological parameters of the virtual human subject can include muscle power and the total sum of muscular energy production, among others.

The muscle power performance metric is determined as a product of muscle force $f_m$ and muscle velocity $i_m$ at an endpoint along the path of motion to the endpoint direction of motion. Specifically, muscle power is determined by:

$$P_{Muscle} = \Sigma_m (f_m i_m) \qquad (66)$$

The total sum of muscular energy production can be described as the sum of five terms, activation heat rate $\dot{A}$, maintenance heat rate $\dot{M}$, shortening heat rate $\dot{S}$ and work rate $\dot{W}$. Specifically, the sum of muscular energy production is determined by:

$$\dot{E} = \dot{A} + \dot{M} + \dot{S} + \dot{W} \qquad (67)$$

The performance metrics, including those computed based on joint (i.e., physical) parameters and/or those computed based on muscle (i.e., physiological) parameters can be combine to produce a single performance index. The single performance index can be determined for any endpoint on the motion path to the endpoint of the task during accomplishment of the task. For example, the performance index can be determined at any endpoint of the virtual human subject (not shown) along the motion paths 1508 in FIGS. 15B and 1512 in FIG. 15C. In another embodiment, the single performance index can be determined at the endpoint of the task (e.g., overall performance index). For example, the performance index can be determined at the endpoint 1510 in FIG. 15B and endpoint 1514 in FIG. 15D.

Figure 13:
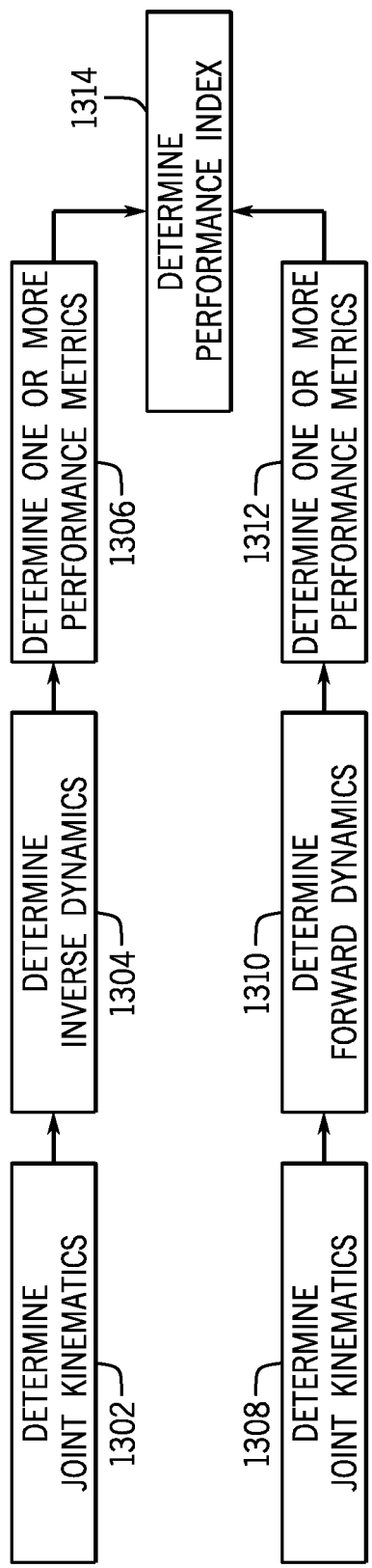
FIG. 13 is a flow chart showing exemplary processes for determining a plurality of performance metrics, and performance index according to one embodiment.

FIG. 13 illustrates an exemplary method including determining a performance index according to one embodiment. At block 1302, joint kinematics, including posture and pose, are determined. At block 1304, inverse dynamics based on the kinematics are determined. The inverse dynamics can include determining joint torque and joint effort based on the joint kinematics (e.g., blocks 1206, 1208, FIG. 12). At block 1306, one or more performance metrics are determined, and in one embodiment, include performance metrics that quantify a capability of the virtual human subject to accomplish the task based on physical parameters of the virtual human subject (e.g., Equations 62-65). At block 1314, a performance index is determined based on the one or more performance metrics. In one embodiment, a plurality of performance indices are determined for any endpoint on the motion path to the endpoint of the task during accomplishment of the task.

Referring still to FIG. 13, the performance index can also be based on physiological parameters. At block 1308, joint kinematics, including posture and pose, are determined. At block 1310, forward dynamics based on the kinematics are determined. The forward dynamics can include determining muscle torque and muscle effort (e.g., block 1212 and 124, FIG. 12). At block 1312, performance metrics are determined, and in one embodiment, include performance metrics that quantify a capability of the virtual human subject to accomplish a task based on physiological parameters of the virtual human subject (e.g., Equations 66-67). At block 1314, a performance index is determined based on the performance metrics. In one embodiment, a plurality of performance indices are for any endpoint on the motion path to the endpoint of the task during accomplishment of the task. In a further embodiment, the performance index at block 1314, is determined based on performance metrics determined at block 1306 and performance metrics determined at block 1312.

Referring again to FIG. 11, block 1108 includes generating a visual representation of the virtual human subject and the task to be executed based on at least one of the motion descriptors and the one or more performance metrics. In one embodiment, generating the visual representation includes identifying one or more regions of feasibility based on at least one of the motion descriptors and the one or more performance metrics. In another embodiment, one or more regions of feasibility are based on the performance index. The one or more regions of feasibility can be graphically represented on the visual representation. The visual representation can be visualized in a two-dimensional or three-dimensional space. For example, the motion descriptors and/or the one or more performance metrics can be visualized as a two-dimensional slice of a three-dimensional space, overlaid on an image of the virtual human subject.

Further, the visual representation can also include displaying the one or more performance metrics and/or the performance index at any endpoint on the motion path to the endpoint of the task during accomplishment of the task. Alternatively, the performance metric and/or the performance index can be displayed at the endpoint direction of motion of the task. For example, the illustration in FIG. 15B can be generated as a visual representation and can include the performance metric and/or the performance index (not shown) at any endpoint on the motion path 1508 and/or the endpoint 1510.

In another embodiment, the method includes receiving a modification of at least one of the vehicle occupant package design model data, the task and parameters describing the virtual human subject. In one embodiment, the modification is received from a user input. For example, on a graphical user interface on a display. The method also includes updating the visual representation incorporating the modification. For example, the design analysis system 106 can update the visual representation incorporating the modification. Incorporating the modification can in include, in some embodiments, scaling the virtual human subject model, updating the plurality of motion descriptors of the virtual human subject including determining a manipulation over time of the degrees of freedom of the virtual human subject during accomplishment of the task, updating the performance metrics and/or the performance index, and/or updating the visual representation based on the modification.

As an illustrative example, the modification can include a change in a parameter defining the virtual human subject, for example, age, height and/or weight. According to this modification, the virtual human subject model, is scaled according to the modified age, height and/or weight. The motion descriptors, the performance metrics and ultimately the visual representation are updated according to the modification and the scaled virtual human subject model. This creates an interactive and dynamic vehicle package design system, allowing a user to modify and visualize different vehicle package designs based on different tasks and different virtual human subjects. In another example, as shown in FIG. 15, the modification can include a change in the vehicle package design, for example, the location of the handbrake. In FIG. 15B, the location of the emergency handbrake 1504 is slightly forward of the location of the emergency handbrake 1504 in FIG. 15A. This modification can be initiated by the user, for example, by dragging the handbrake on a user interface of a display to a new location.

Figure 14:
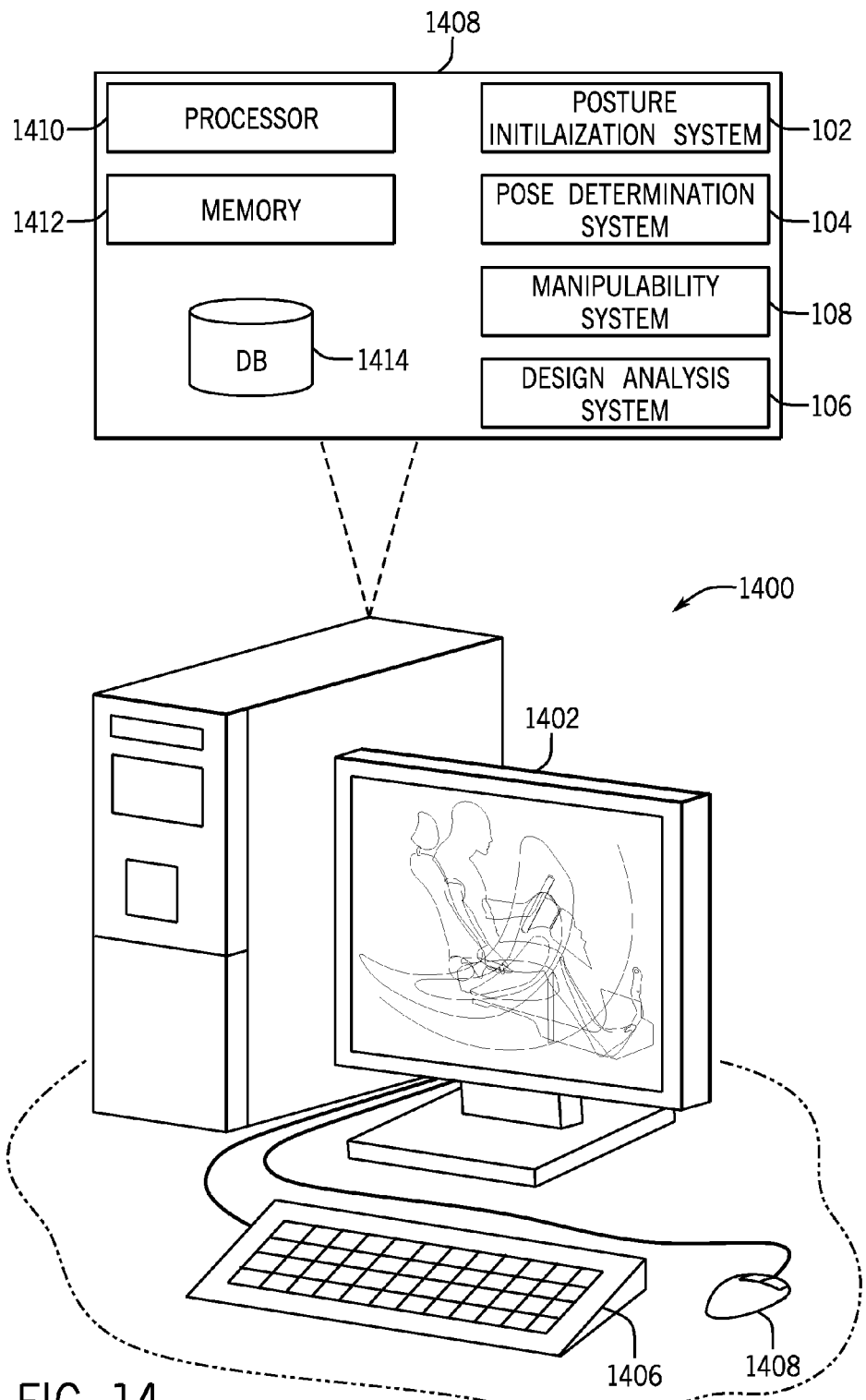
FIG. 14 is a schematic diagram of an exemplary system for interactive vehicle package design, according to one embodiment.

Referring now to FIG. 14, an exemplary interactive vehicle package design system 1400 is illustrated. As will be discussed in further detail herein, the system 1400 can include one or more components of the system 100 of FIG. 1. Although the system 1400 is illustrated as a desktop computing device in FIG. 14, the system 1400 can also be embodied as any type of computing device, including a mobile device (e.g., a mobile phone, a tablet, among others). Specifically, the system 1400, includes one or more input/output devices including a display 1402, a mouse 1404 and a keyboard 1406. The display 1402 can be a touch display allowing for user touch input. The display 1402 provides a visual representation of the vehicle occupant package design model. In some embodiments, more than one display 1402 can be provided. The mouse 1404 and the keyboard 1406 also provide for user input. Other types of devices can be used for input/output including tactile devices and audio devices, among others.

FIG. 14 also illustrates a simplified block diagram 1408 of the internal hardware/software of the system 1400. In particular, the system 1400 can include a processor 1410, a memory 1412 and a database 1414. The system 100 of FIG. 1 can also be included and can be implemented in one or more of the processor 1410, the memory 1412 and/or the database 1414. Specifically, the system 100 in FIG. 14 can include one or more of the posture initialization system 102, the pose determination system 104, the manipulability system 108 and the design analysis system 106. The components of system 1400 and system 100 can be combined, omitted, or organized into different architectures for various embodiments. Other hardware/software components can also be included, for example, graphics engine and software, communication devices for wired and wireless networking and communication, among others, but are not shown for simplicity.

The interactive vehicle package design system 1400 will now be described in detail. The system can include an input/output device for receiving user input indicating parameters defining vehicle occupant package design model data including a task to be executed. For example, a user (not shown), can input parameters defining vehicle occupant package design model data utilizing the display 1402 (e.g., touch screen), the mouse 1404 and/or the keyboard 1406. In one embodiment, the task to be executed can be identified as a high-level description of the task received from a user input. For example, the user can input the task as "pulling an emergency handbrake" through speech input or touch/tactile input. As an illustrative example, a user can drag an icon of an emergency handbrake on the display 1402. Based on the task, stored data (e.g., vehicle occupant package design model data) in the memory 1412 and/or the database 1414 associated with the task can be retrieved. The user can also load previously stored vehicle occupant package design model data associated with the task to the system 1400, for example, stored in the memory 1412 and/or the database 1414.

The input/output device can also receive parameters defining a virtual human subject for executing the tasks, wherein the virtual human subject includes a plurality of degrees of freedom. The parameters defining the virtual human subject can be received, for example, from a user input, retrieved from a memory 1412 or a database 1414 and/or determined, for example, by the design analysis system 106 based on one of a user input or the task.

The system also includes a processor communicatively coupled to the input/output device. For example, the system 1400 includes the processor 1410. The processor includes a design analysis system determines a plurality of motion descriptors of the virtual human subject including determining a manipulation over time of the degrees of freedom of the virtual human subject during accomplishment of the task. For example, the design analysis system 106 with the posture initialization system 102 and the pose determination system 104 can determine the plurality of motion descriptors. In one embodiment, the design analysis system 106 determines one or more endpoints of motion of the task, for example, for one or more locations identified in the task space boundary, and for each endpoint of motion of the task, a motion path (i.e., a trajectory), indicating an endpoint direction of motion of a path the virtual human subject used to accomplish the task (i.e., the path to the endpoint motion of the task). Accordingly, in one embodiment, determining a plurality of motion descriptors of the virtual human subject includes determining a manipulation over time of the degrees of freedom of the virtual human subject for any endpoint of the virtual human subject along a motion path during accomplishment of the task. Said differently, the motion descriptors can be determined for any endpoint on the virtual human subject at any instance in time based on the location of the endpoint in the motion path and the direction of motion of the endpoint. The motion descriptors can also be determined for one or more endpoints of motion of the task (including one or more endpoints of motion of the task for one or more locations identified in the task space boundary).

Specifically, determining the plurality of motion descriptors of the virtual human subject can be accomplished by determining a Jacobian between the degrees of freedom and the task for any endpoint during accomplishment of the task. The Jacobian is determined for any endpoint on the motion path to the endpoint of the task during accomplishment of the task. The motion descriptors include a posture and a pose of the virtual human subject for any endpoint during accomplishment of the task. As discussed above, the posture initialization system 102 is configured to determine an initial posture of the virtual subject using the design model data, the parameters defining the vehicle human subject, the task to be accomplished and a set of constraints. Using the initial posture, the pose determination system 104 is configured to determine the pose of the virtual subject as the virtual subject carries out the one or more specified tasks while also adhering to the set of constraints. As part of the determination of a posture, the pose determination system 104 determines a Jacobian that is used to move the subject between one time step and the next in accomplishing the task.

The design analysis system also determines one or more performance metrics based on the motion descriptors. For example, the design analysis system 106 can determine one or more performance metrics based on the motion descriptors. In one embodiment, the performance metrics can include, but are not limited to, the manipulability metrics discussed above. Specifically, the pose of the virtual subject in carrying out the tasks is analyzed to determine the manipulability metrics used to determine the feasibility (or usability) of the design for potential drivers and/or passengers matching the size and shape of the virtual subject. The manipulability system 108 is configured to make use of the Jacobian determined as part of the pose, the task to be accomplished, a particular endpoint of direction of motion indicating the path the virtual human subject used to accomplish the task. As discussed above, examples of manipulability metrics include: a force metric quantifying the subject's ability apply a joint torque as a force to a component of the design (e.g., equations 44, 45 and 46), a velocity metric quantifying the subject's ability to cause the component to achieve velocity (e.g., equations 42, 43, 47), and a dynamic metric quantifying the subject's ability to cause the component to achieve acceleration (e.g., equations 48, 49, 50, 51).

In a further embodiment, the one or more performance metrics quantify a capability of the virtual human subject to accomplish the task based on physical parameters of the virtual human subject. For example, performance metrics that quantify a capability of the virtual human subject to accomplish the task based on physical parameters of the virtual human subject can include: mechanical power index (equation 62), total mechanical energy index (equation 63), kinetic energy index (equation 64), effort index (equation 65), among others. In another embodiment, the one or more performance metrics quantify a capability of the virtual human subject to accomplish the task based on physiological parameters of the virtual human subject. For example, performance metrics that quantify a capability of the virtual human subject to accomplish the task based on physiological parameters of the virtual human subject: muscle power (equation 66) and the total sum of muscular energy production (equation 67), among others.

In some embodiments, the design analysis system 106, can determine a performance index. In particular, the performance metrics, including those computed based on joint (i.e., physical) parameters and/or those computed based on muscle (i.e., physiological) parameters can be combine to produce a single performance index. The single performance index can be determined for any endpoint on the motion path to the endpoint of the task during accomplishment of the task. In another embodiment, the single performance index can be determined at the endpoint direction of motion (e.g., overall performance index).

The design analysis system 106 generates a visual representation of the vehicle occupant package design model data, the virtual human subject and the task to be executed based on the motion descriptors and the one or more performance metrics and presents the visual representation on a graphical user interface of the input/output device. For example, in FIG. 14, a visual representation 1416 is presented on the display 1402.

In one embodiment, the design analysis system 106 identifies one or more regions of feasibility based on at least one of the motion descriptors and the one or more performance metrics and the design analysis system 106 generates an indication of the one or more regions of feasibility on the visual representation. For example, the regions of feasibility illustrated in FIG. 10 can be presented on the display 1402. In another embodiment, the visual representation can also include displaying the performance metric and/or the performance index at any endpoint on the motion path to the endpoint of the task during accomplishment of the task. Alternatively, the performance metric and/or the performance index can be displayed at the endpoint direction of motion of the task. For example, the illustration in FIG. 15B can be generated as a visual representation and can include the performance metric and/or the performance index (not shown) at any endpoint on the motion path 1508 and/or the endpoint 1510.

Further, the system 1400 can dynamically modify and update the vehicle occupant package design model data, the task or parameters defining the virtual human subject. Specifically, the design analysis system 106 receives a modification of at least one of the vehicle occupant package design model data, the task or parameters defining the virtual human subject. The modification can be received, for example, via the touch screen of the display 1402. The design analysis system 106 can update the visual representation incorporating the modification. Incorporating the modification can in include, in some embodiments, scaling the virtual human subject model, updating the plurality of motion descriptors of the virtual human subject including determining a manipulation over time of the degrees of freedom of the virtual human subject during accomplishment of the task for each point in space on a path to an endpoint direction of motion, updating the performance metrics and/or the performance index, and/or updating the visual representation based on the modification.

As an illustrative example, a user (not shown) utilizing the system 1400 can input a modification into the system 1400, via for example, the touchscreen display or another input/output device. In one example, the modification includes a a change in a parameter defining the virtual human subject, for example, age, height and/or weight. According to this modification, the virtual human subject model shown is scaled according to the modified age, height and/or weight. The motion descriptors, the performance metrics, the performance index and the visual representation are updated according to the modification. In another embodiment, as shown in FIG. 15, the modification can include a change in the vehicle package design, for example, the location of the handbrake. In FIG. 15B, the location of the emergency handbrake 1504 is slightly forward of the location of the emergency handbrake 1504 in FIG. 15A. This modification can be initiated by the user, for example, by dragging the handbrake on a user interface of the display 1402 to a new location. In some embodiments, the visual representation is updated in real-time according to the modification. This dynamic modification allows a user to create and modify vehicle package designs easily using analysis of human physical interaction.

ADDITIONAL CONSIDERATIONS

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments include process steps and instructions described herein in the form of an algorithm. It should be noted that the process steps and instructions of the embodiments can be embodied in software, firmware or hardware, and when embodied in software, could be downloaded to reside on and be operated from different platforms used by a variety of operating systems. The embodiments can also be in a computer program product which can be executed on a computing system.

The embodiments also relate to an apparatus for performing the operations herein. This apparatus may be specially constructed for the purposes, e.g., a specific computer, or it may include a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Memory can include any of the above and/or other devices that can store information/data/programs and can be transient or non-transient medium, where a non-transient or non-transitory medium can include memory/storage that stores information for more than a minimal duration. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the method steps. The structure for a variety of these systems will appear from the description herein. In addition, the embodiments are not described with reference to any particular programming language. It will be appreciated that a variety of programming languages may be used to implement the teachings of the embodiments as described herein, and any references herein to specific languages are provided for disclosure of enablement and best mode.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments, which is set forth in the claims.

While particular embodiments and applications have been illustrated and described herein, it is to be understood that the embodiments are not limited to the precise construction and components disclosed herein and that various modifications, changes, and variations may be made in the arrangement, operation, and details of the methods and apparatuses of the embodiments without departing from the spirit and scope of the embodiments as defined in the appended claims.

The invention claimed is:

1. A computer-implemented method for determining the feasibility of a vehicle occupant package design model using an interactive vehicle package design system, the method comprising:
   receiving at a computer processor and from a peripheral device, a high-level description of a task to be executed, wherein the task to be executed is a physical task to be accomplished through motion by a virtual human subject within a task space boundary of the vehicle occupant package design model, and the high-level description of the task to be executed is entered as a user input at the peripheral device;
   receiving at the computer processor, vehicle occupant package design model data based on the high-level description of the task, wherein the vehicle occupant package design model data is entered as user input at the peripheral device, retrieved from a database or memory of the peripheral device, or determined by a design analysis systems of the peripheral device;
   receiving at the computer processor, parameters defining the virtual human subject, the parameters being for executing the task based on the high-level description of the task, and including physical parameters of the virtual human subject and physiological parameters of the virtual human subject, wherein the virtual human subject includes a plurality of degrees of freedom, and wherein the parameters are entered as user input at the peripheral device, retrieved from the database or the memory, or determined by the design analysis system;
   receiving at the computer processor, a set of constraints based on the high-level description of the task, the set of constraints limiting the motion of the virtual human subject within the task space boundary while accomplishing the task, and including a dynamic consistency constraint that preferences a solution to a degree of freedom vector minimizing energy required to complete the task with diagonal coefficients corresponding to diagonal elements of a joint space inertia matrix and ensuring that the virtual human subject is dynamically balanced while accomplishing the task, wherein the set of constraints is determined by a posture initialization system of the peripheral device;
   calculating via a design analysis system of the peripheral device, a plurality of motion descriptors of the virtual human subject including calculating a manipulation over time of the plurality of degrees of freedom of the virtual human subject during accomplishment of the task;
   calculating via the design analysis system, a physical performance metric index quantifying a capability of the virtual human subject to accomplish the task based on the physical parameters of the virtual human subject and the plurality of motion descriptors;
   calculating via the design analysis system, a physiological performance metric index quantifying a capability of the virtual human subject to accomplish the task based on the physiological parameters of the virtual human subject and the plurality of motion descriptors;
   calculating via the design analysis system, a performance index based on the physical performance metric index and the physiological performance metric index;
   generating via the design analysis system, a visual representation of the vehicle occupant package design model data and the virtual human subject executing the task based on the plurality of motion descriptors and the performance index;
   displaying the visual representation on a display of the peripheral device;
   evaluating via the design analysis system and based on the performance index, a feasibility of the virtual human subject accomplishing the task in the vehicle occupant package design model;
   graphically representing the feasibility on the display as part of the visual representation;
   receiving via the computer processor, a modification of at least one of the vehicle occupant package design model data, the task, the set of constraints, or the parameters describing the virtual human subject, wherein the modification is made by modifying the visual representation using an input/output device of the peripheral device; and
   updating the visual representation according to the modification.

2. The method of claim 1, wherein evaluating the feasibility includes identifying one or more regions of feasibility for the virtual human subject accomplishing the task based on the plurality of motion descriptors and the performance index, and wherein the one or more regions of feasibility are graphically represented on the display as part of the visual representation.

3. The method of claim 1, wherein calculating the plurality of motion descriptors of the virtual human subject includes determining via the design analysis system, a Jacobian between the degrees of freedom and the task for any endpoint during accomplishment of the task.

4. The method of claim 1, wherein the physical performance metric index is based on joint mechanics, and the physiological performance metric index is based on muscle mechanics.

5. An interactive vehicle package design system for determining the feasibility of a vehicle occupant package design model, the system comprising:
  a processor that executes a computer program code;
  a computer-readable storage medium containing the computer program code configured to:
    receive via the processor and from a user input entered on an input/output device of the system, a vehicle occupant package design model data including a high-level description of a task to be executed, wherein the task is a physical task to be accomplished through a motion by a virtual human subject at a plurality of different locations within a task space boundary of the vehicle occupant package design model
    receive via the processor, parameters defining the virtual human subject, the parameters being for executing the task, wherein the virtual human subject includes a plurality of degrees of freedom;
    receive via the processor, a set of constraints limiting the motion of the virtual human subject within the task space boundary while accomplishing the task, and including a dynamic consistency constraint that preferences a solution to a degree of freedom vector minimizing energy required to complete the task with diagonal coefficients corresponding to diagonal elements of a joint space inertia matrix and ensuring that the virtual human subject is dynamically balanced while accomplishing the task;
    determine via the processor, a plurality of endpoints of motion of the task for each of the plurality of different locations within the task space boundary based on the vehicle occupant package design model data and the parameters defining the virtual human subject, and for each endpoint of the plurality of endpoints, determine a motion path indicating an endpoint direction of motion of a path the virtual human subject uses to accomplish the task;
    calculate via the processor, a plurality of motion descriptors over time of the plurality of degrees of freedom of the virtual human subject during accomplishment of the task for each endpoint of the plurality of endpoints of motion for each of the plurality of different locations within the task space boundary;
    calculate via the processor, a one or more performance metrics based on the plurality of motion descriptors for each endpoint of the plurality of endpoints of motion for each of the plurality of different locations within the task space boundary;
    generate via the processor, a visual representation of the vehicle package design model data and the virtual human subject executing the task based on the plurality of motion descriptors and the one or more performance metrics for output on a display of the system;
    calculate via the processor and based on the one or more performance metrics, a performance index, and using the performance index to evaluate a feasibility of the virtual human subject accomplishing the task in the vehicle occupant package design model; and
    generate via the processor a graphical representation of the feasibility as part of the visual representation for output on the display;
    receive via the computer processor, a modification of at least one of the vehicle occupant package design model data, the task, the set of constraints, or the parameters describing the virtual human subject, wherein the modification includes user input modifying the visual representation using the input/output device;
    update the visual representation according to the modification.

6. The system of claim 5, wherein evaluating the feasibility includes identifying one or more regions of feasibility for the virtual human subject accomplishing the task based on the plurality of motion descriptors and the one or more performance metrics, and wherein the one or more regions of feasibility are graphically represented as part of the visual representation for output on the display.

7. The system of claim 5, wherein the user input modifying the visual representation using the input/output device includes a user input on a graphical user interface of the display.

8. The system of claim 5, wherein the one or more performance metrics quantify a capability of the virtual human subject to accomplish the task based on physical parameters of the virtual human subject.

9. The system of claim 5, wherein the one or more performance metrics quantify a capability of the virtual human subject to accomplish the task based on physiological parameters of the virtual human subject.

10. The system of claim 5, wherein generating the visual representation includes graphically representing each endpoint of the plurality of endpoints of motion for each of the plurality of different locations within the task space boundary with each of the one or more performance metrics associated with said endpoint.

11. The method of claim 7, wherein the modification includes scaling the virtual human subject model, updating the plurality of motion descriptors of the virtual human subject, updating the physical performance metric, updating the physiological performance metric, updating the performance index, changing a task space boundary, or combinations thereof.

12. An interactive vehicle package design system for determining the feasibility of a vehicle occupant package desing model, the system comprising:
  a peripheral device that receives user input entered on a graphical user interface of the peripheral device, the user input including:
    a vehicle occupant package design model data including a task space boundary of the vehicle occupant package design model,
    a high-level description of a task to be executed, wherein the task is a physical task to be accomplished through motion by a virtual human subject within the task space boundary
    parameters defining the virtual human subject, the parameters being for executing the task and including physical parameters of the virtual human subject and physiological parameters of the virtual human subject, wherein the virtual human subject includes a plurality of degrees of freedom, and
    a set of constraints based on the high-level description of the task, the set of constraints limiting motion of the virtual human subject within the task space boundary while accomplishing the task, and including a dynamic consistency constraint that preferences a solution to a degree of freedom vector minimizing energy required to complete the task with diagonal coefficients corresponding to diagonal elements of a joint space inertia matrix and ensuring that the virtual human subject is dynamically balanced while accomplishing the task; and a processor communicatively coupled to the peripheral device and including a design analysis system that performs:
calculating a plurality of motion descriptors of the virtual human subject including determining a manipulation over time of the degrees of freedom of the virtual human subject during accomplishment of the task,
calculating a physical performance metric index quantifying a capability of the virtual human subject to accomplish the task based the physical parameters of the virtual human subject and the plurality of motion descriptors;
calculating a physiological performance metric index quantifying a capability of the virtual human subject to accomplish the task based on the physiological parameters of the virtual human subject and the plurality of motion descriptors;
calculating a performance index based on the physical performance metric index and the physiological performance metric index;

generating a visual representation of the vehicle occupant package design model data and the virtual human subject executing the task based on the plurality of motion descriptors and the performance index,
presenting the visual representation on the graphical user interface of the peripheral device,
evaluating based on the performance index, a feasibility of the virtual human subject accomplishing the task in the vehicle occupant package design model,
graphically representing the feasibility on the graphical user interface as part of the visual representation,
receiving a modification of at least one of the vehicle occupant package design model data, the task, the set of constraints, or the parameters describing the virtual human subject, wherein the modification is made by modifying the visual representation using graphical user interface, and
updating the visual representation according to the modification.

13. The system of claim 12, wherein evaluating the feasibility includes identifying one or more regions of feasibility for the virtual human subject accomplishing the task based on the plurality of motion descriptors and the performance index, and wherein the one or more regions of feasibility are graphically represented as part of the visual representation on the graphical user interface.

* * * * *